United States Patent
Kang et al.

(10) Patent No.: US 11,075,260 B2
(45) Date of Patent: Jul. 27, 2021

(54) SUBSTRATE COMPRISING RECESSED INTERCONNECTS AND A SURFACE MOUNTED PASSIVE COMPONENT

(71) Applicant: QUALCOMM Incorporated, San Diego, CA (US)

(72) Inventors: Kuiwon Kang, San Diego, CA (US); Chin-Kwan Kim, San Diego, CA (US); Hong Bok We, San Diego, CA (US); Jaehyun Yeon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/176,915

(22) Filed: Oct. 31, 2018

(65) Prior Publication Data
US 2020/0135839 A1  Apr. 30, 2020

(51) Int. Cl.
| H01L 23/498 | (2006.01) |
| H01L 49/02 | (2006.01) |
| H01L 21/56 | (2006.01) |
| H01L 23/31 | (2006.01) |

(52) U.S. Cl.
CPC .............. *H01L 28/40* (2013.01); *H01L 21/56* (2013.01); *H01L 23/3128* (2013.01); *H01L 23/49822* (2013.01)

(58) Field of Classification Search
CPC ..... H01L 23/3128; H01L 28/40; H01L 21/56; H05K 1/0306
See application file for complete search history.

(56) References Cited

U.S. PATENT DOCUMENTS

| 10,325,891 B1* | 6/2019 | Lim ..................... H01L 23/5383 |
| 2014/0091428 A1* | 4/2014 | Hossain .................. H01L 23/13 257/532 |
| 2014/0217575 A1* | 8/2014 | Hung ...................... H01L 23/36 257/713 |
| 2014/0291818 A1* | 10/2014 | Zhao ..................... H01L 23/552 257/659 |
| 2016/0086930 A1* | 3/2016 | Koey .................... H01L 21/486 257/773 |
| 2017/0213794 A1* | 7/2017 | Baek ....................... H01L 21/56 |
| 2017/0243826 A1* | 8/2017 | Lin .................... H01L 23/49811 |
| 2018/0026022 A1* | 1/2018 | Lee ....................... H01L 21/561 257/659 |
| 2019/0088621 A1* | 3/2019 | Yang ....................... H01L 24/11 |
| 2019/0131285 A1* | 5/2019 | Kim ........................ H01L 24/19 |

(Continued)

*Primary Examiner* — Nathan W Ha
(74) *Attorney, Agent, or Firm* — Qualcomm Incorporated

(57) ABSTRACT

A device that includes a substrate, a die, and a discrete capacitor. The substrate includes a dielectric layer and a plurality of interconnects formed in the dielectric layer. The discrete capacitor is coupled to the substrate through a first solder interconnect and a second solder interconnect. The first solder interconnect and the second solder interconnect are located within the dielectric layer. The die is coupled to the substrate. In some implementations, the first solder interconnect is located in a first cavity of the dielectric layer, and the second solder interconnect is located in a second cavity of the dielectric layer. In some implementations, the substrate includes a first cavity that is filled with a first via and the first solder interconnect; and a second cavity that is filled with a second via and the second solder interconnect.

24 Claims, 19 Drawing Sheets

(56) References Cited

U.S. PATENT DOCUMENTS

| | | | |
|---|---|---|---|
| 2019/0139853 A1* | 5/2019 | Oh | H01L 24/20 |
| 2019/0164893 A1* | 5/2019 | Kim | H01L 24/20 |
| 2019/0189549 A1* | 6/2019 | Jo | H01L 23/3128 |
| 2019/0229047 A1* | 7/2019 | Moon | H01L 24/20 |
| 2019/0237406 A1* | 8/2019 | Choi | H01L 23/552 |
| 2020/0051901 A1* | 2/2020 | Hossain | H01L 21/486 |

* cited by examiner

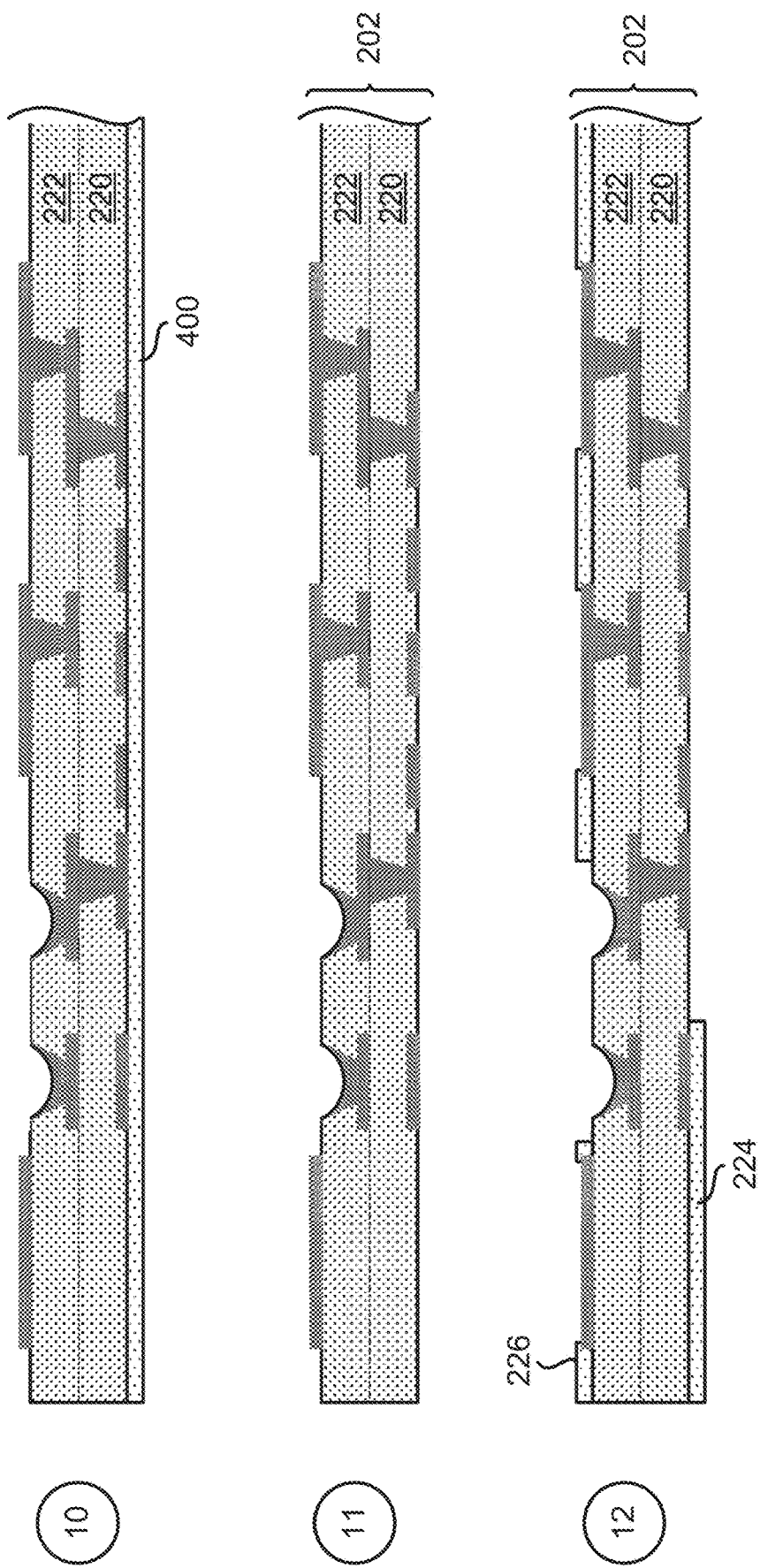

SUBSTRATE COMPRISING RECESSED INTERCONNECTS AND A SURFACE MOUNTED PASSIVE COMPONENT

BACKGROUND

Field

Various features relate to substrates for integrated devices, but more specifically to substrates comprising a surface mounted passive component.

Background

FIG. 1 illustrates an integrated device 100 that includes a substrate 102 and a die 104. The die 104 is coupled to a first surface of the substrate 102 through a plurality of solder interconnects 140, which may include bumps and solder.

The substrate 102 includes a plurality of dielectric layers 120, a plurality of interconnects 122, and a plurality of surface interconnects 123. Each layer of the dielectric layers 120 includes a patterned metal layer and vias. The substrate 102 includes a first solder resist layer 124, a second solder resist layer 126, and a plurality of solder interconnects 130.

A capacitor 150 is mounted over the first surface of the substrate 102. More specifically, the capacitor 150 is coupled to pads of the substrate 102 through solder interconnects 160 and 162. The solder interconnects 160 and 162 are located over the dielectric layers 120. The solder interconnects 160 and 162 are located between the capacitor 150 and the pads of the substrate 102. This causes the capacitor 150 to be located higher over the substrate 102, which means that the capacitor 150 is effectively thicker that its actual thickness. In addition, solder interconnect (e.g., 160, 162) for each respective terminal of the capacitor 150 may flow towards each other and touch each other, causing an unintended joint to occur between the solder interconnects 160 and 162.

Therefore, there is a need for providing a substrate with a surface mounted passive component such that the passive component takes up as little space as possible. Ideally, the surface mounted passive component is mounted over the substrate in such a way that a short does not occur between the terminals of the passive component.

SUMMARY

Various features relate to substrates for integrated devices, but more specifically to substrates comprising a surface mounted passive component.

One example provides a device that includes a substrate and a discrete passive component. The substrate includes a dielectric layer and a plurality of interconnects formed in the dielectric layer. The discrete passive component is coupled to the substrate through a solder interconnect. The solder interconnect is located within the dielectric layer.

Another example provides an integrated device that includes a substrate, a die, and means for capacitance. The substrate includes a dielectric layer and a plurality of interconnects formed in the dielectric layer. The means for capacitance is coupled to the substrate through a means for soldering. The means for soldering is located within the dielectric layer. The die is coupled to the substrate.

Another example provides a method for fabricating a device. The method provides a substrate that includes a dielectric layer, a cavity in the dielectric layer, and a plurality of interconnects formed in the dielectric layer. The method couples a discrete capacitor to the substrate through a solder interconnect such that the solder interconnect is located within the cavity of the dielectric layer.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a substrate, a die, and a discrete passive component (e.g., discrete capacitor). The substrate includes a dielectric layer and a plurality of interconnects formed in the dielectric layer. The discrete passive component is coupled to the substrate through a first solder interconnect and a second solder interconnect. The first solder interconnect and the second solder interconnect are located within the dielectric layer. The die is coupled to the substrate. In some implementations, the first solder interconnect is located in a first cavity of the dielectric layer, and the second solder interconnect is located in a second cavity of the dielectric layer. In some implementations, the substrate includes (i) a first cavity that is filled with a first via and the first solder interconnect; and (ii) a second cavity that is filled with a second via and the second solder interconnect. The first via may include a curved surface (e.g. concave surface) that is coupled to the first solder interconnect. The second via may include a curved surface (e.g. concave surface) that is coupled to the second solder interconnect.

Figure 1:
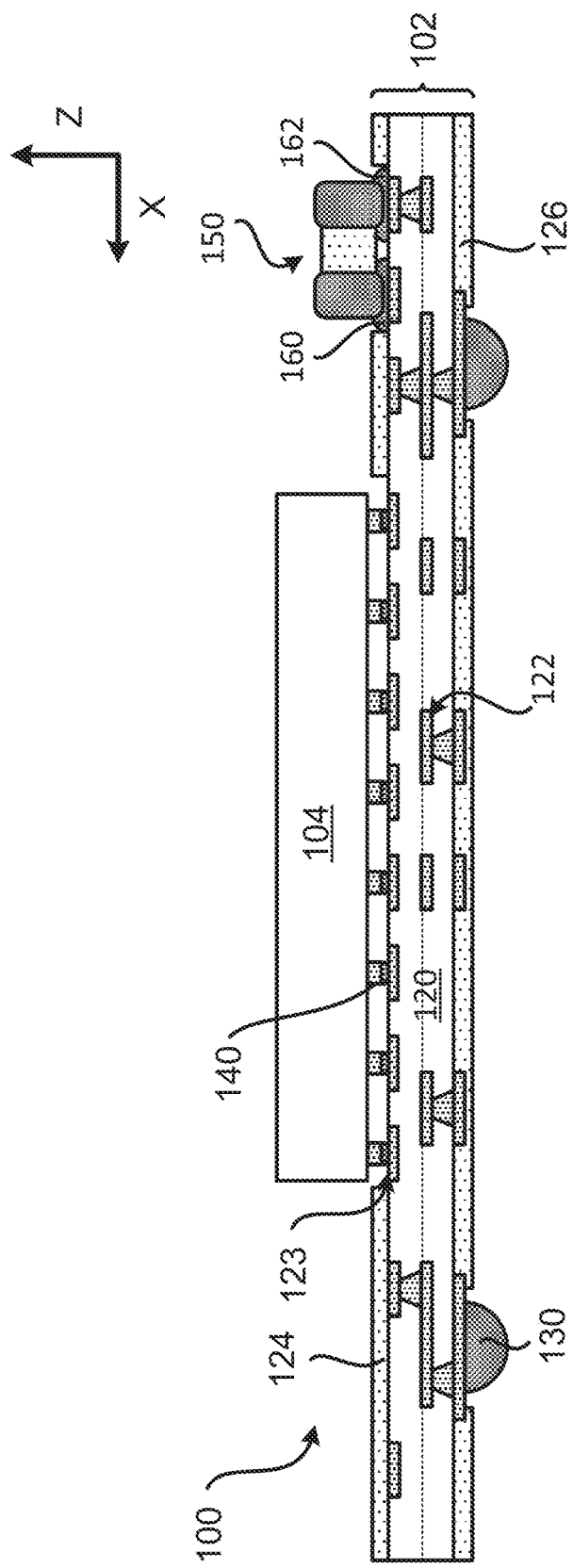
FIG. 1 illustrates a profile view of an integrated device that includes a die, a substrate and a surface mounted passive component.
Figure 2:
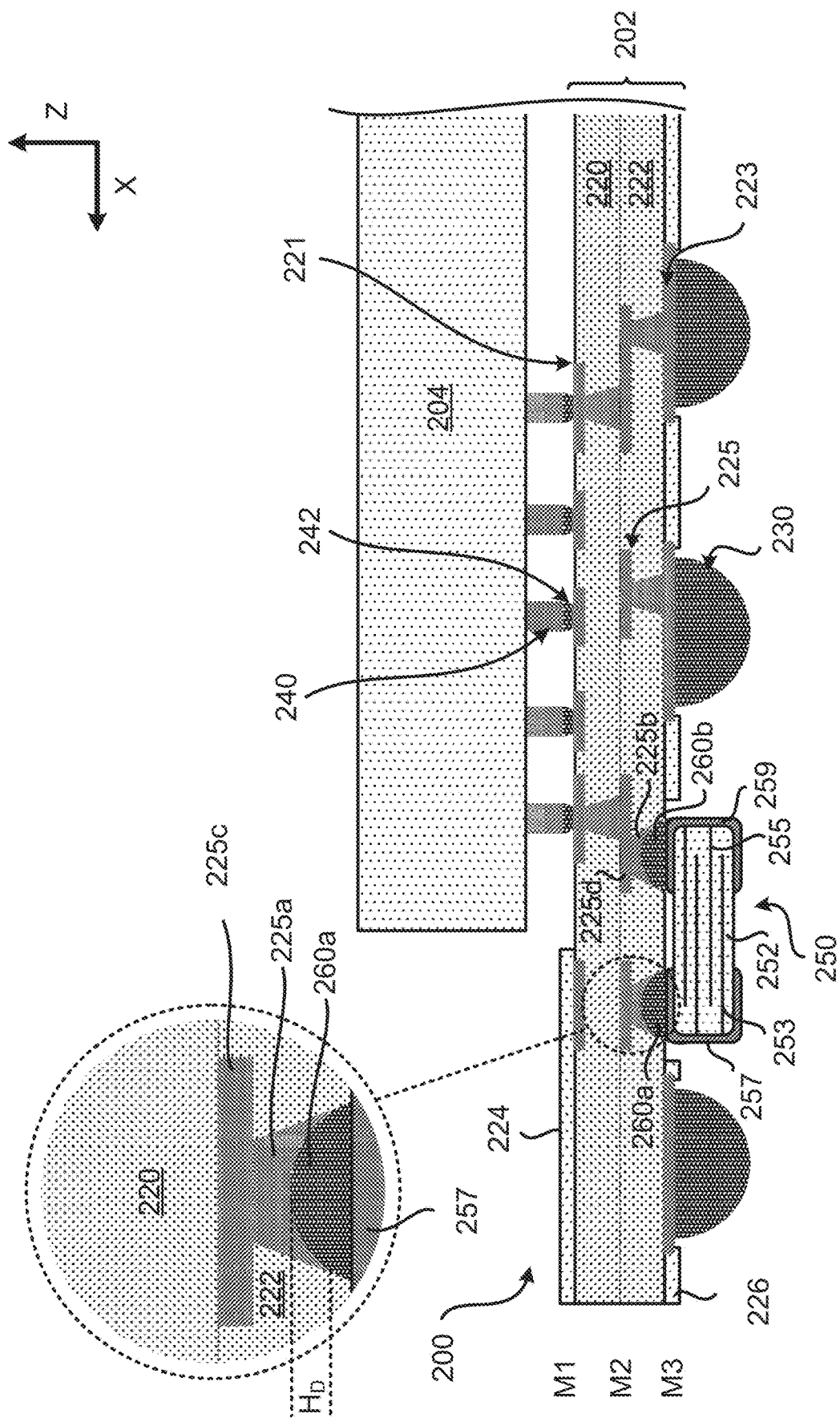
FIG. 2 illustrates a profile view of an integrated device that includes a die, a substrate, and a surface mounted passive component.

Exemplary Device Comprising Substrate with Surface Mounted Discrete Passive Component FIG. 2 illustrates a profile view of a device 200 that includes a substrate 202, a die 204 and a passive component 250. The device 200 may be an integrated device (e.g., integrated circuit device) and/or an integrated package (e.g., integrated circuit package).

The passive component 250 may be a discrete passive component (e.g., discrete capacitor). A component that is discrete may be a component that is fabricated separately from the substrate 202. For example, the passive component 250 may be made using a different process than the substrate 202. A discrete component may be an off the shelf component. As will be further described below, a passive component (e.g., 250, 950) may be a discrete passive component that is coupled to the substrate 202 in such a manner as to minimize the overall space occupied by the passive component, while using a coupling that reduces the likelihood of shorting to occur. The passive component (e.g., 250, 950) may include a multi-layer ceramic capacitor (MLCC).

The substrate 202 includes a dielectric layer 220 (e.g., first dielectric layer), a dielectric layer 222 (e.g., second dielectric layer), a first solder resist layer 224, a second solder resist layer 226, a plurality of interconnects 221, a plurality of interconnects 223, and a plurality of interconnects 225. The substrate 202 may be a coreless substrate, such an embedded trace substrate (ETS). The dielectric layers 220 and 222 may be made of the same or different material. Materials for the dielectric layers 220 and 222 may include dry film, such as Ajinomoto build-up film (ABF) and/or prepreg (PPG). The PPG may include glass fibers with resin. It is noted that the substrate 202 may include more than two dielectric layers. In some implementations, the dielectric layers 220 and 222 may be considered as one dielectric layer.

The plurality of interconnects 221 may include traces and/or pads. The plurality of interconnects 221 is formed about a first surface of the substrate 202. For example, the plurality of interconnects 221 may be formed over the first surface of the substrate 202 and/or embedded in the first surface of the substrate 202. The first surface of the substrate 202 may be a first planar surface that faces the die 204.

The die 204 is coupled to the substrate 202 through a plurality of bump interconnects 240 and a plurality of solder interconnects 242. For example, the die 204 may be coupled to the plurality of interconnects 221 through the plurality of bump interconnects 240 and the plurality of solder interconnects 242.

The plurality of interconnects 223 may include traces and/or pads. The plurality of interconnects 223 is formed about a second surface of the substrate 202. For example, the plurality of interconnects 223 may be formed over the second surface of the substrate 202 and/or embedded in the second surface of the substrate 202. The second surface of the substrate 202 may be a second planar surface that faces away from the die 204. The second surface of the substrate 202 may be a surface that is opposite to the first surface of the substrate 202.

The plurality of interconnects 225 may include traces, pads and/or vias. The plurality of interconnects 225 is formed in the substrate 202. In particular, the plurality of interconnects 225 is formed in the dielectric layers 220 and/or 222. The plurality of interconnects 225 may include embedded interconnects. The plurality of interconnects 225 is coupled to the plurality of interconnects 221 and the plurality of interconnects 223.

As mentioned above, the passive component 250 may be a discrete capacitor, such as a multi-layer ceramic capacitor (MLCC). A discrete capacitor may be a means for capacitance. The passive component 250 may include a dielectric 252, a first plurality of electrodes 253, a second plurality of electrodes 255, a first terminal 257 and a second terminal 259. The first plurality of electrodes 253 is coupled to the first terminal 257. The second plurality of electrodes 255 is coupled to the second terminal 259.

The passive component 250 is coupled to the second surface of the substrate 202. In some implementations, the passive component 250 may be a land side mounted passive component. However, it is noted that the passive component 250 may be coupled to the first surface of the substrate 202. In such an instance, the passive component 205 may be a die side mounted passive component.

The passive component 250 is coupled to the substrate 202 through solder interconnects (e.g., means for soldering). In particular, the first terminal 257 of the passive component 250 is coupled to a first solder interconnect 260a, and the second terminal 259 of the passive component 250 is coupled to a second solder interconnect 260b. The first solder interconnect 260a is located in a first cavity of the dielectric layer 222, and the second solder interconnect 260b is located in a second cavity of the dielectric layer 222. The first cavity includes a via 225a (e.g., first partial via). The first solder interconnect 260a is coupled to the via 225a through a curved surface (e.g. concave surface) of the via 225a. The via 225a is coupled to an interconnect 225c (e.g., pad), which is embedded in the dielectric layer of the substrate 202. The second cavity includes a via 225b (e.g., second partial via). The second solder interconnect 260b is coupled to the via 225b through a curved surface (e.g. concave surface) of the via 225b. The via 225b is coupled to an interconnect 225d (e.g., pad) that is embedded in the dielectric layer of the substrate 202. A cavity that includes a partial via and solder interconnect may have a height that is in a range of 15-80 micrometers (μm). For example, the first cavity that includes the via 225a and the first solder interconnect 260a may have a height that is in a range of 15-80 micrometers (μm). Examples of cavities are illustrated and described in FIGS. 4A-4E and 5A-5E.

FIG. 2 illustrates that the solder interconnects that couple the passive component to the substrate, may be coupled to interconnects that are recessed. The term partial via may mean that the electrically conducting material (e.g., metal, copper) that forms the via does not completely fill the cavity. The curved surface of the via may be a concave surface. The curved surface may be referred as a via dimple. The curvature of the surface of the via may be expressed as the height ($H_D$) of a dimple of the via. In some implementations, the height ($H_D$) of the dimple of the via can be quantified as the difference between the lowest point of the surface of the via and the highest point of the surface of the via. In some implementations, the height ($H_D$) is about 0-50 percent (%) of the height of the dielectric layer 220. In some implementations, a cavity that includes a partial via and solder interconnect may have a height that is in a range of 15-80 micrometers (μm). The height ($H_D$) may be about 0-50 percent (%) of the height of the cavity (e.g., 430, 431) that includes a partial via and solder interconnect.

There are several technical advantages to the structure and configuration of FIG. 2. One, forming the solder interconnects in the cavities of the dielectric layer 222 allows the passive component 250 to be as close to the surface of the substrate 202 as possible. By taking away part of the via and the surface pad that would normally be there, a passive component 250 that is thicker can be mounted to the substrate 202. When the passive component 250 is a capacitor, providing a thicker capacitor means providing a capacitor with a higher capacitance value. In many instances, the thickness of the passive component 250 is limited by the height of the solder interconnects 230 that are coupled to the substrate 202. In some implementations, when the solder interconnects 230 have a pitch of about 0.35 millimeters (mm) or less, a passive component 250 that has a maximum thickness of 110 micrometers (μm) may be coupled to the substrate 202. However, different implementations may use solder interconnects 230 with different pitches and/or passive components with different maximum thicknesses.

Two, forming the solder interconnects in the cavities of the dielectric layer (e.g., 222) means that the solder interconnects are less likely to overflow, contact other connections and/or make unintended joints. Since the solder interconnects (e.g., 260a, 260b) are in the cavities, the cavities act as a barrier that may prevent a large portion of the solder interconnects from flowing towards other connections, and thereby preventing unintended connections or joints.

FIG. 2 illustrates an example of a structure and/or configuration for securely coupling a passive component to a substrate, while reducing the overall amount of space that the passive component occupies and reducing the likelihood of shorting to occur between the terminals of the passive components. An example of fabricating the device 200 is illustrated and described in at least FIGS. 4A-4E.

Figure 3:
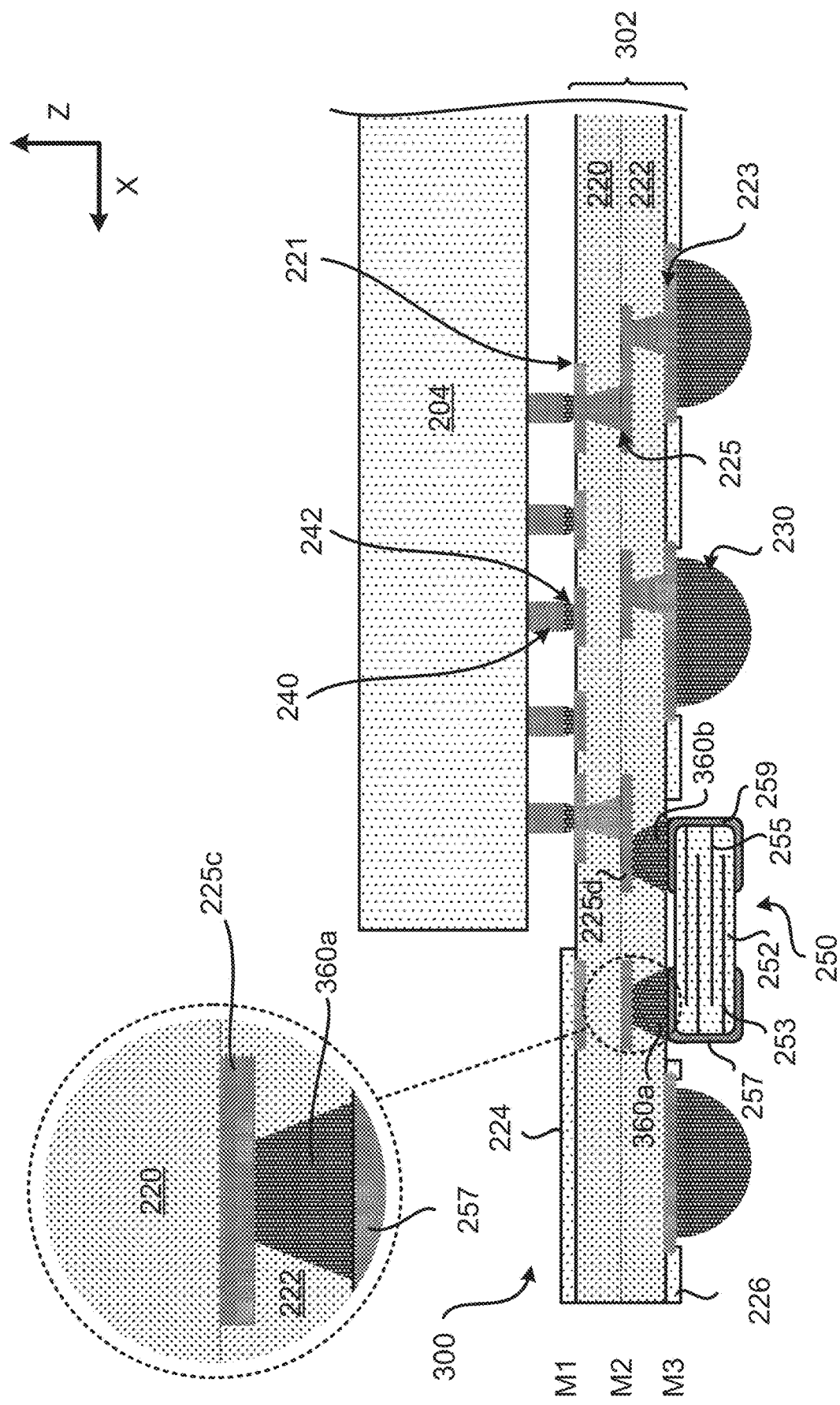
FIG. 3 illustrates a profile view of another integrated device that includes a die, a substrate, and a surface mounted passive component.

FIG. 3 illustrates another example of a device 300 that includes a passive component coupled to a substrate. The device 300 is similar to the device 200 of FIG. 2. FIG. 3 illustrates that the device 300 includes a substrate 302, the die 204 and the passive component 250. The device 300 may be an integrated device (e.g., integrated circuit device) and/or an integrated package (e.g., integrated circuit package). The substrate 302 is similar to the substrate 202.

FIG. 3 illustrates the passive component 250 is coupled to the substrate 302 through solder interconnects. In particular, the first terminal 257 of the passive component 250 is coupled to a first solder interconnect 360a, and the second terminal 259 of the passive component 250 is coupled to a second solder interconnect 360b. The first solder interconnect 360a is located in a first cavity of the dielectric layer 222 such that the first solder interconnect 360a occupies a majority (e.g., substantially all) of the cavity, and the second solder interconnect 360b is located in a second cavity of the dielectric layer 222 such that the second interconnect 360b occupies a majority (e.g., substantially all) of the cavity. The first solder interconnect 360a is coupled to the interconnect 225c (e.g., pad), which is embedded in the dielectric layer of the substrate 302. The second solder interconnect 260b is coupled to the interconnect 225d (e.g., pad), which is embedded in the dielectric layer of the substrate 302. A cavity that includes the solder interconnect may have a height that is in a range of 15-80 micrometers (μm). For example, the first cavity that includes the first solder interconnect 360a may have a height that is in a range of 15-80 micrometers (μm). Examples of cavities that include solder interconnects are illustrated and described in FIGS. 4A-4E and 5A-5E.

FIGS. 2 and 3 illustrate a substrate with several metal layers (e.g., M1, M2, M3). The labeling of the metal layers of the substrates is exemplary. Different implementations, may label the metal layers differently. For example, the metal layers may be labeled as M1, M2 and M3 from top to bottom. In some implementations, the M1 and M3 metal layers are considered as a top metal layer and a bottom metal layer, respectively, of the substrate. In some implementations, the M1 and M3 metal layers may be considered the first and last metal layers, respectively, of the substrate. FIGS. 2 and 3 illustrate that the passive component 250 may bypass the top and/or bottom metal layers of the substrate (e.g., may bypass the first and/or last metal layers of the substrate), when the passive component 250 is coupled to the substrate. For example, the passive component 250 may be coupled through solder interconnects, to the partial vias and/or metal layer(s) between the top and bottom metal layers of the substrate. In a similar manner, when a passive component is coupled to any of the substrates (e.g., 702, 802, 902, 1002) described in the disclosure, the passive component may bypass the top and/or bottom metal layers of the substrates (e.g., 702, 802, 902, 1002). Thus, the passive component may be coupled to one or more metal layers (e.g., middle metal layers, intermediate metal layers) located between the top and bottom metal layers (e.g., between the first and last metal layers) of the substrate. In the example of FIGS. 2 and 3, the intermediate metal layer may be M2. If there are N metal layers in a substrate, where N is greater than 2, then M1 and N may be the top and bottom metal layers, or vice versa, and the metal layer(s) between M1 and N are the middle metal layers and/or intermediate metal layers of the substrate.

FIG. 3 illustrates an example of a structure and/or configuration for securely coupling a passive component to a substrate, while reducing the overall amount of space that the passive component occupies and reducing the likelihood of shorting to occur between the terminals of the passive components. The dimensions and advantages that are described for the device 200 may also apply to the device 300. An example of fabricating the device 300 is illustrated and described in at least FIGS. 5A-5E.

Exemplary Sequence for Fabricating a Device Comprising Substrate with Surface Mounted Discrete Passive Component FIG. 4 (which includes FIGS. 4A-4E) illustrates an exemplary sequence for providing or fabricating a device that includes a die, a substrate and a passive component coupled to the substrate. In some implementations, the sequence of FIGS. 4A-4E may be used to provide or fabricate the device 200 of FIG. 2, or any of the devices described in the present disclosure.

It should be noted that the sequence of FIGS. 4A-4E may combine one or more stages in order to simplify and/or clarify the sequence for providing or fabricating the device. In some implementations, the order of the processes may be changed or modified. In some implementations, one or more of processes may be replaced or substituted without departing from the spirit of the disclosure.

Figure 4A:
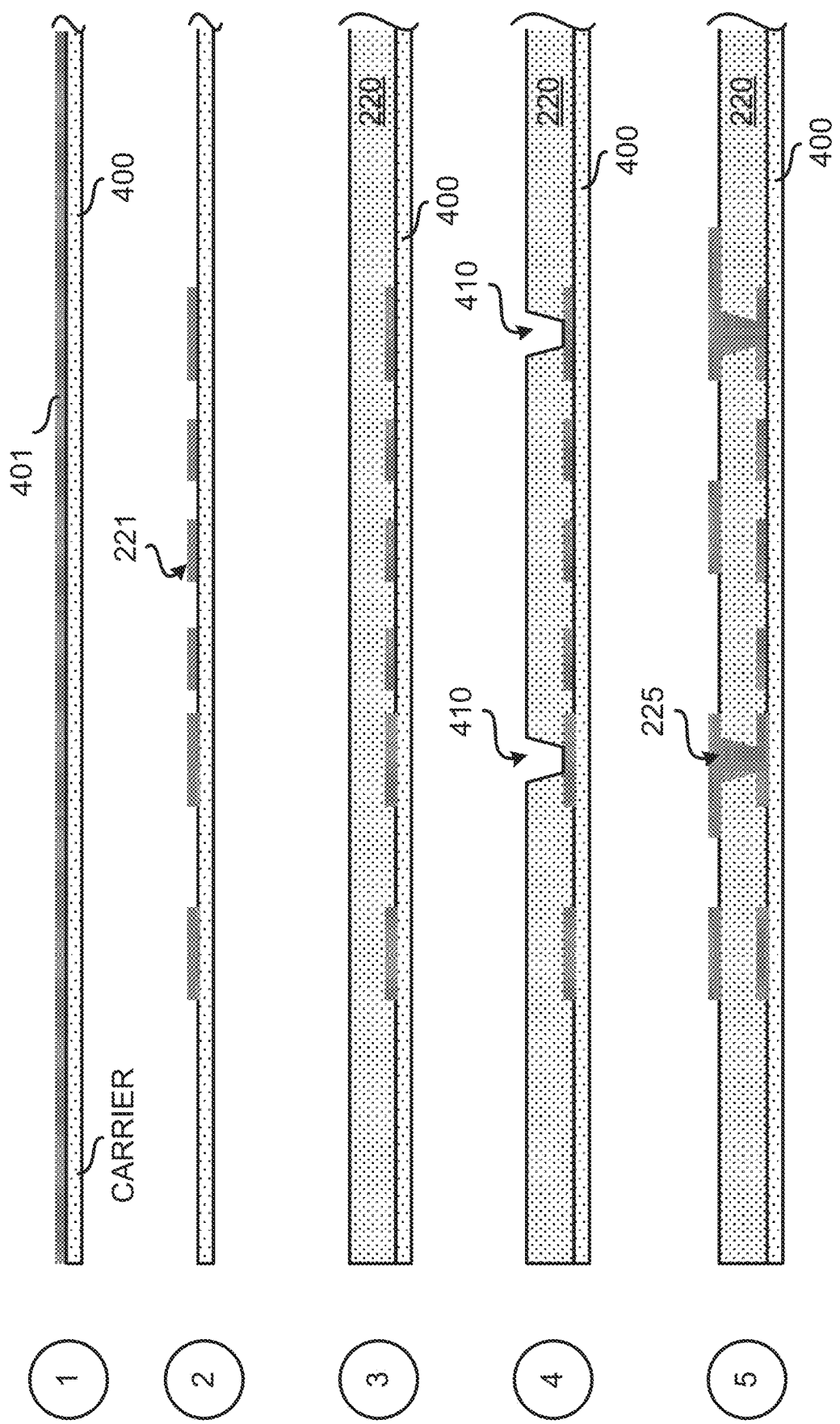
FIG. 4 (comprising FIGS. 4A-4E) illustrates an exemplary sequence for fabricating an integrated device that includes a die, a substrate and a surface mounted passive component.

Stage 1, as shown in FIG. 4A, illustrates a state after a carrier 400 and a metal layer 401 are provided. The metal layer 401 may include several metal layers. The metal layer 401 may include a foil layer and/or a seed layer. The foil layer and/or the seed layer may include a copper layer.

Stage 2 illustrates a state after a plurality of interconnects 221 is formed over carrier 400. The plurality of interconnects 221 may include the metal layer 401. In some implementations, a plating process may be used to form the interconnects 221 over the metal layer 401. In some implementations, forming the interconnects may include providing a patterned metal layer over and/or in the metal layer 401.

Stage 3 illustrates a state after the dielectric layer 220 (e.g., first dielectric layer) is formed over the plurality of interconnects 221. A lamination process may be used to form the dielectric layer 220. However, different implementations may use different processes for forming the dielectric layer 220. In addition, different materials may be used for the dielectric layer 220.

Stage 4 illustrates a state after several cavities 410 are formed in the dielectric layer 220. An etching process (e.g., photo-etching process) or a laser ablation process may be used to form the cavities 410.

Stage 5 illustrates a state after the plurality of interconnects 225 is formed in the cavities 410 and over the dielectric layer 220. A plating process may be used to form the plurality of interconnects 225.

Figure 4B:
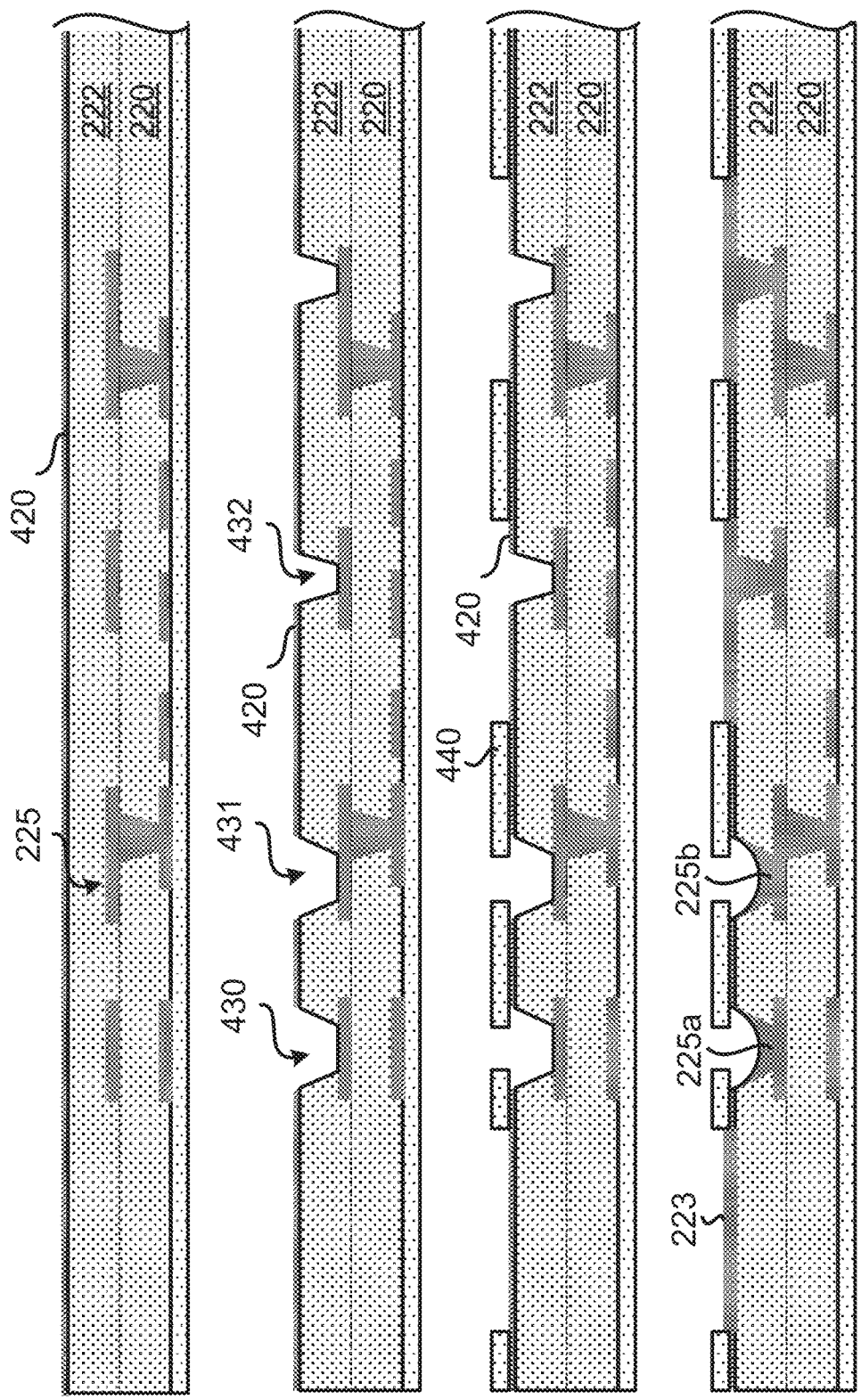

Stage 6, as shown in FIG. 4B, illustrates a state after the dielectric layer 222 (e.g., second dielectric layer) and the metal layer 420 are provided over the dielectric layer 220. The metal layer 420 may be a seed layer and/or a foil layer.

Stage 7 illustrates a state after the cavities 430, 431 and 432 are formed in the dielectric layer 222. The cavities 430 and 431 have a different size than the cavity 432. In this example, the cavities 430 and 431 are wider and bigger than the cavity 432. The cavities 430, 431 and 432 travel through the metal layer 420 and the dielectric layer 222. An etching process (e.g., photo-etching process) or a laser ablation process may be used to form the cavities 430, 431 and 432.

Stage 8 illustrates a state after a dry film layer 440 is formed over the metal layer 420. In this example, some of the dry film layer 440 is partially covering the cavities 430 and 431.

Stage 9 illustrates a state after the plurality of interconnects 223 and 225 are formed in the dielectric layer 222. In particular, the first via 225a is partially formed in the cavity 430 (e.g., first cavity), and the second via 225b is partially formed in the cavity 431 (e.g., second cavity). The term partially formed in the cavity may mean that the plating process has not completely filled the cavity with a metal layer. The first via 225a and the second via 225b each have a curved surface (e.g. concave surface). Different implementations may have vias with different surface curvature. A plating process may be used to form the plurality of interconnects 223 and 225, the first via 225a and the second via 225b.

Stage 10, as shown in FIG. 4C, illustrates a state after the dry film layer 440 has been decoupled from the metal layer 420. Stage 10 also illustrates a state where part of the metal layer 420 has been removed (e.g., through metal etching or seed etching).

Stage 11 illustrates a state after the carrier 400 has been decoupled from the dielectric layer 220, leaving the substrate 202, which includes the dielectric layers 220 and 222, the plurality of interconnects 221, the plurality of interconnects 223, and the plurality of interconnects 225.

Stage 12 illustrates a state after the first solder resist layer 224 and the second solder resist layer 226 are formed over the substrate 202. The first solder resist layer 224 is formed over a first surface of the substrate 202, and the second solder resist layer 226 is formed over a second surface of the substrate 202.

Figure 4D:
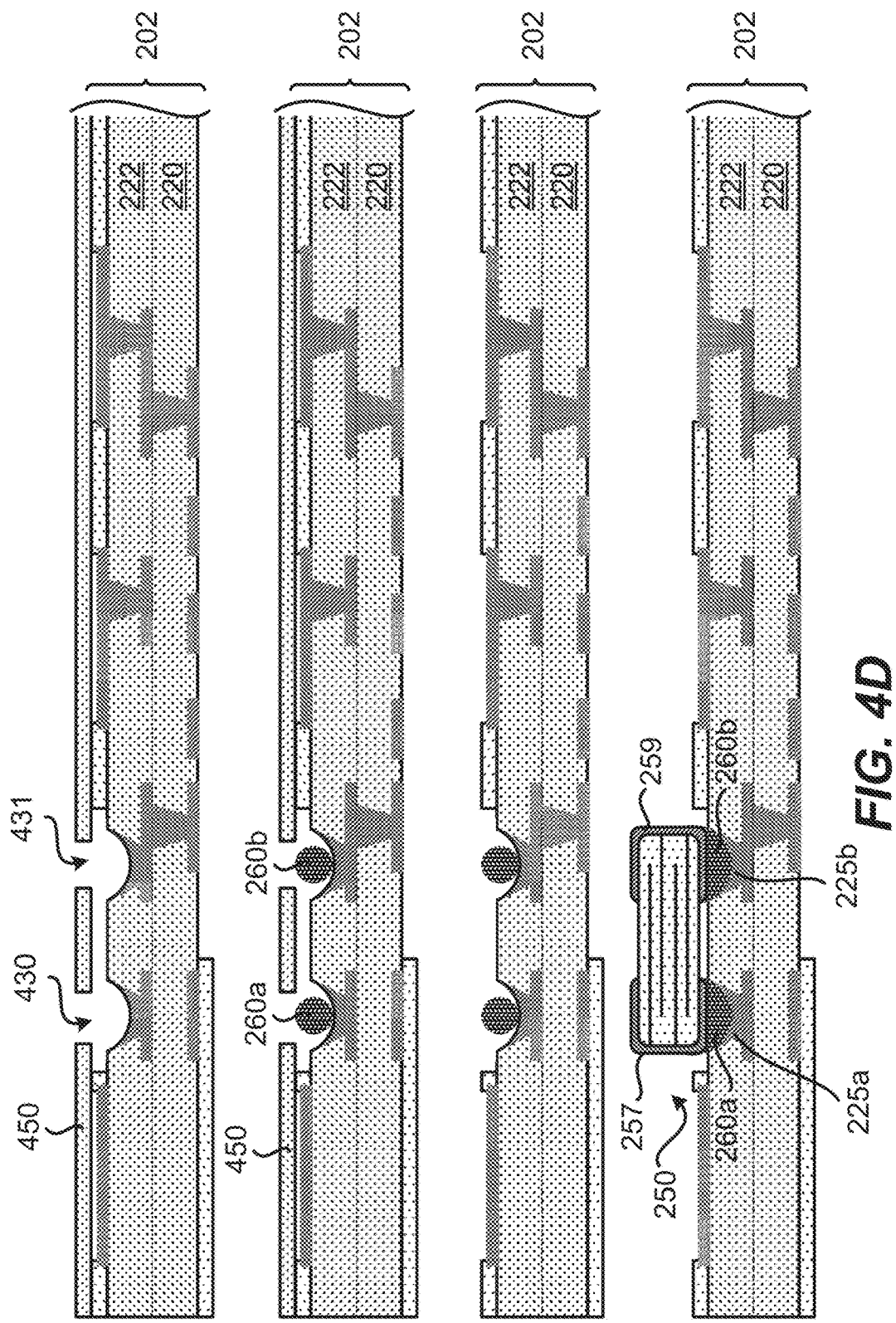

Stage 13, as shown in FIG. 4D, illustrates a state after a mask 450 is formed over the substrate 202. The mask 450 has openings over the cavities 430 and 431.

Stage 14 illustrates a state after the first solder interconnect 260a is provided in the cavity 430, and the second solder interconnect 260b is provided in the cavity 431. In some implementations, the first solder interconnects 260a and the second solder interconnects 260b are provided through a solder printing process. The first solder interconnects 260a and the second solder interconnects 260b may be solder balls.

Stage 15 illustrates a state after the mask 450 has been decoupled from the substrate 202, leaving the first solder interconnects 260a and the second solder interconnects 260b in the cavities 430 and 431, respectively.

Stage 16 illustrates a state after the passive component 250 has been coupled to the substrate 202. In particular, the first terminal 257 of the passive component 250 is coupled to the first solder interconnect 260a, and the second terminal 259 of the passive component 250 is coupled to the second solder interconnect 260b. The first solder interconnect 260a is located at least partially in the cavity 430, and the second solder interconnect 260b is located at least partially in the cavity 431. The first solder interconnect 260a is coupled to the interconnect 225a, and the second interconnect 260b is coupled to the interconnect 225b. Stage 16 may illustrate a state after a reflow process. Stage 16 illustrates a state where a surface of the passive component 250 is touching and/or aligned with the second surface of the substrate 202.

Figure 4E:
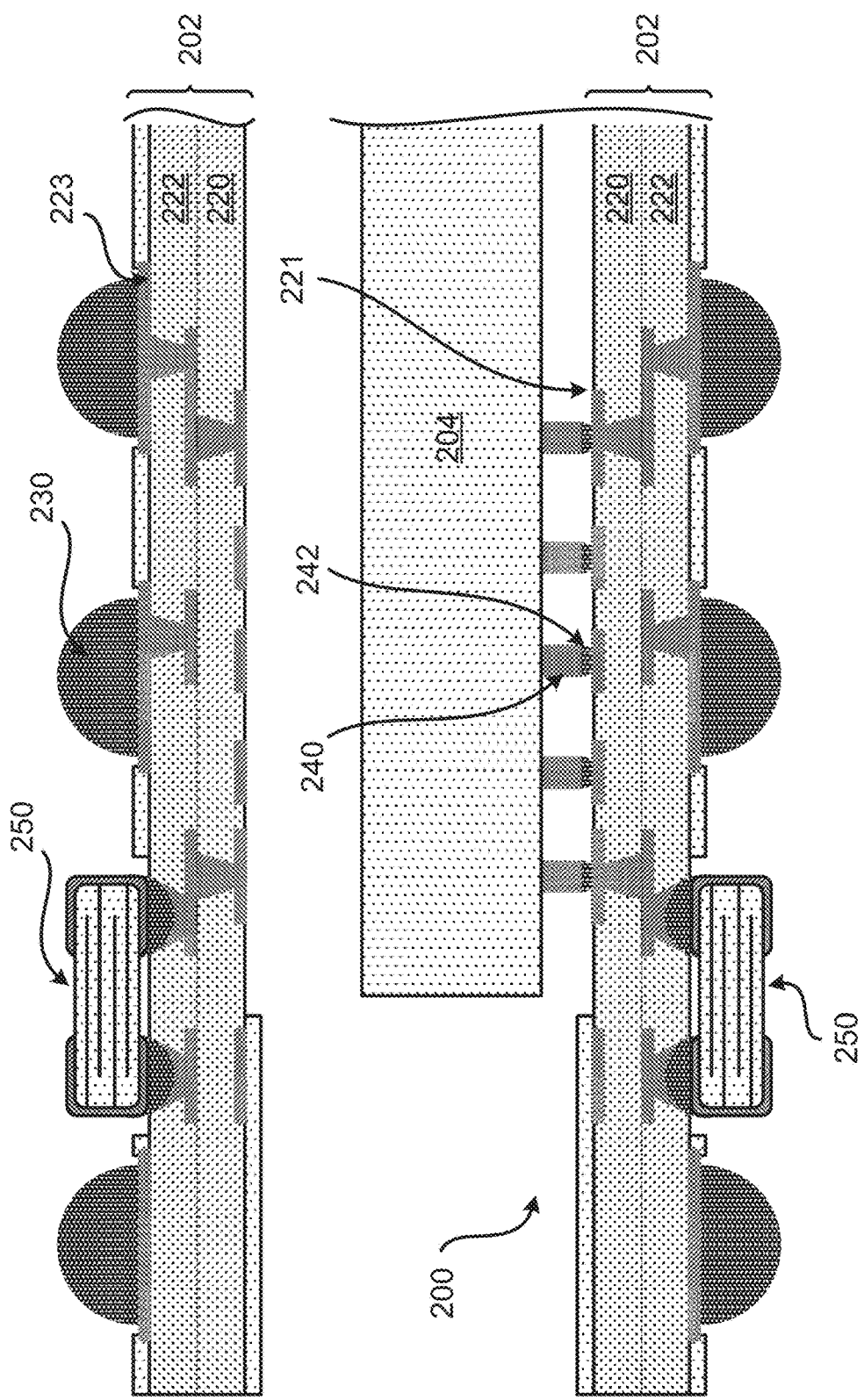

Stage 17, as shown in FIG. 4E, illustrates a state after the plurality of solder interconnects 230 (e.g., solder balls) is coupled to the plurality of interconnects 223.

Stage 18 illustrates a state after the die 204 is coupled to the substrate 202 through the plurality of bump interconnects 240 and the plurality of solder interconnects 242. In some implementations, stage 18 illustrates the device 200 that includes the substrate 202, the die 204 and the passive component 250.

FIGS. 4A-4E illustrate an example of a sequence for fabricating a device that includes a die, a substrate, and a passive component. Different implementations may use a different process and/or sequence.

Exemplary Sequence for Fabricating a Device Comprising Substrate with Surface Mounted Discrete Passive Component FIG. 5 (which includes FIGS. 5A-5E) illustrates an exemplary sequence for providing or fabricating a device that includes a die, a substrate and a passive component coupled to the substrate. In some implementations, the sequence of FIGS. 5A-5E may be used to provide or fabricate the device 300 of FIG. 3, or any of the devices described in the present disclosure.

It should be noted that the sequence of FIGS. 5A-5E may combine one or more stages in order to simplify and/or clarify the sequence for providing or fabricating the device. In some implementations, the order of the processes may be changed or modified. In some implementations, one or more of processes may be replaced or substituted without departing from the spirit of the disclosure.

Figure 5A:
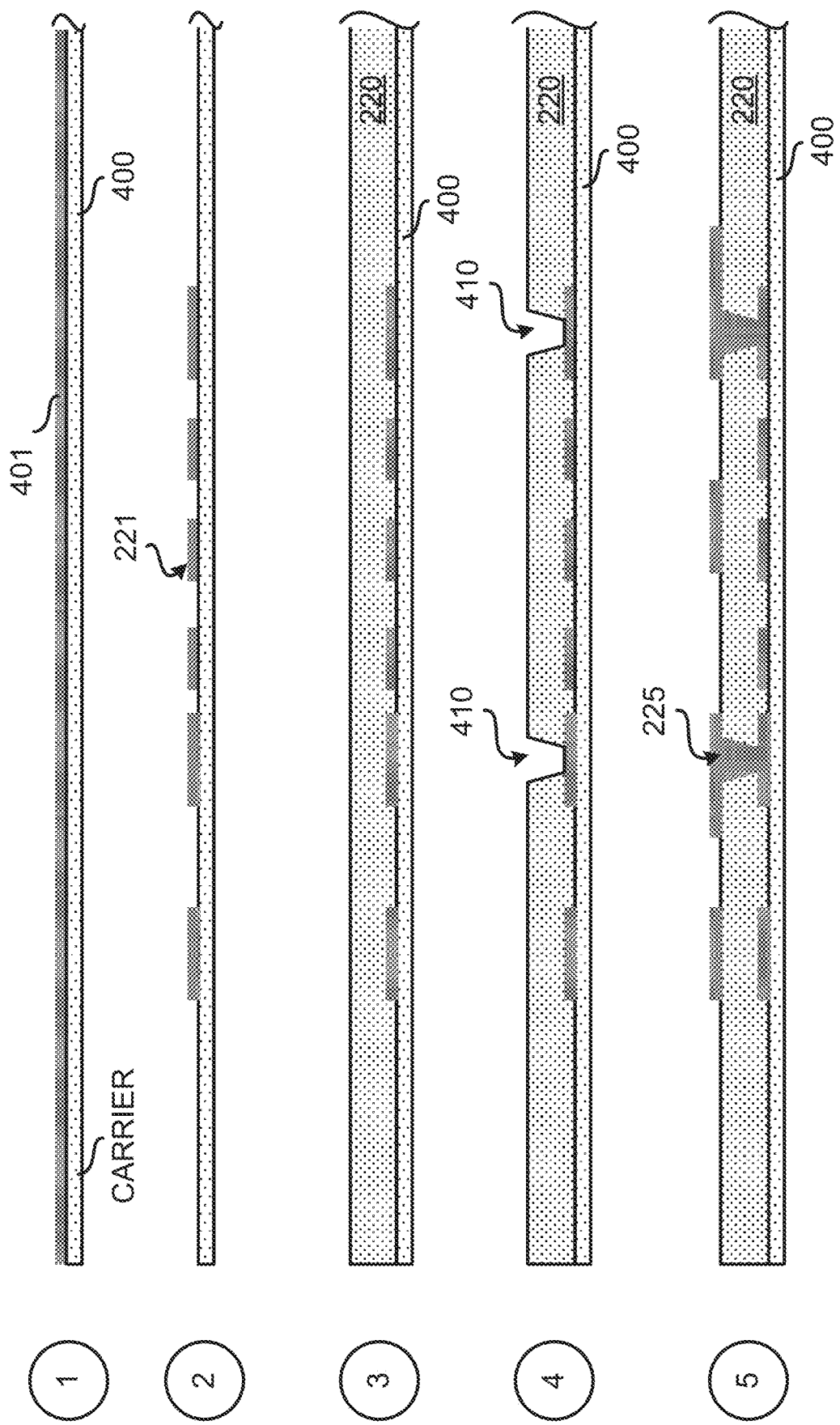
FIG. 5 (comprising FIGS. 5A-5E) illustrates an exemplary sequence for fabricating another integrated device that includes a die, a substrate and a surface mounted passive component.
Figure 5B:
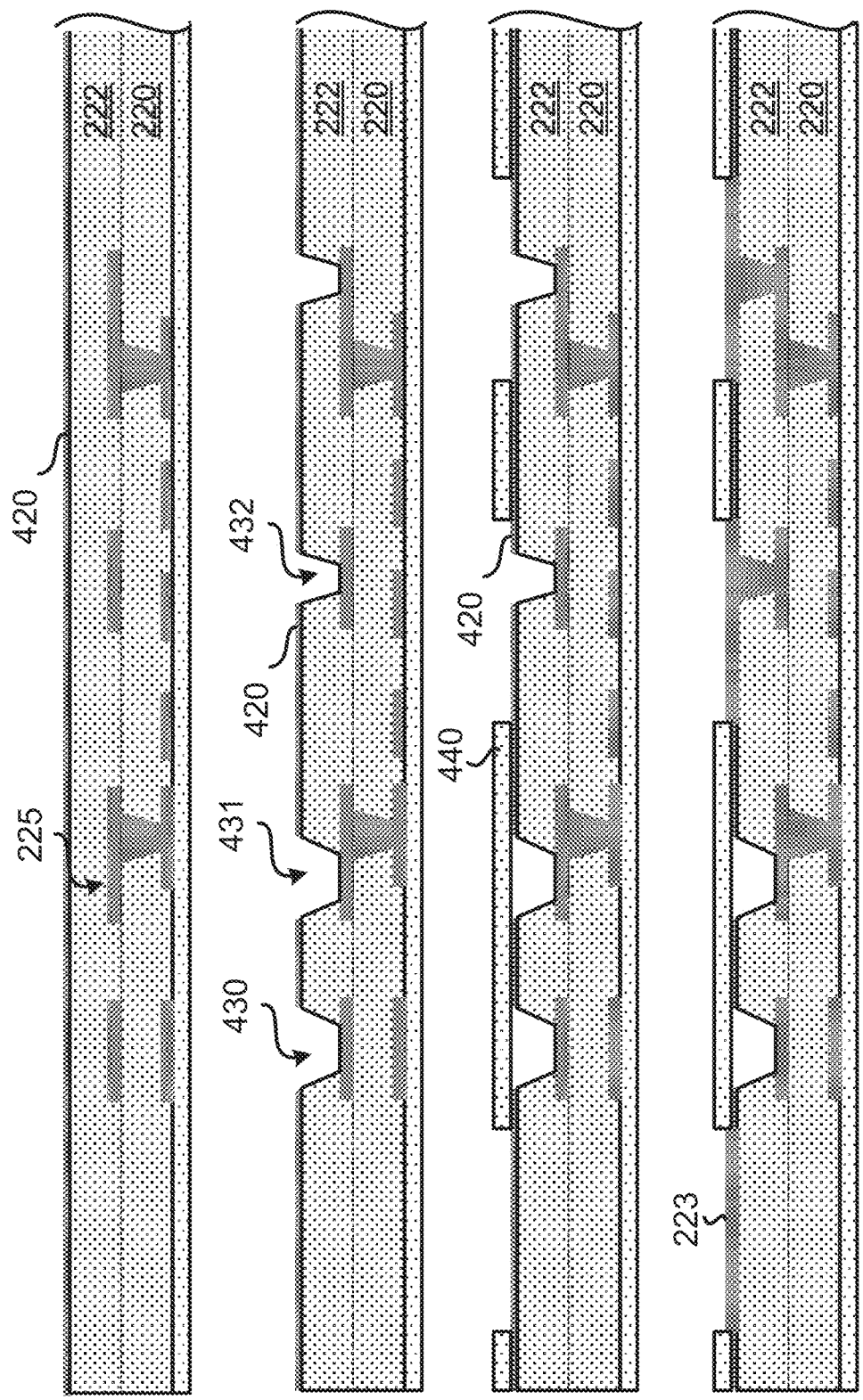

Stages 1 through 7 of FIGS. 5A-5B may be similar to stages 1 through 7 of FIGS. 4A-4B. Thus, the description of stages 1 through 7 of FIGS. 4A-4B may be applicable to stages 1 through 7 of FIGS. 5A-5B.

Stage 8, as shown in FIG. 5B, illustrates a state after a dry film layer 440 is formed over the metal layer 420. In this example, some of the dry film layer 440 covers the cavities 430 and 431.

Stage 9 illustrates a state after the plurality of interconnects 223 and 225 are formed in the dielectric layer 222. A plating process may be used to form the plurality of interconnects 223 and 225. When the dry film layer 440 covers the cavities 430 and 431, it prevents plated vias from being formed in the cavities 430 and 431.

Figure 5C:
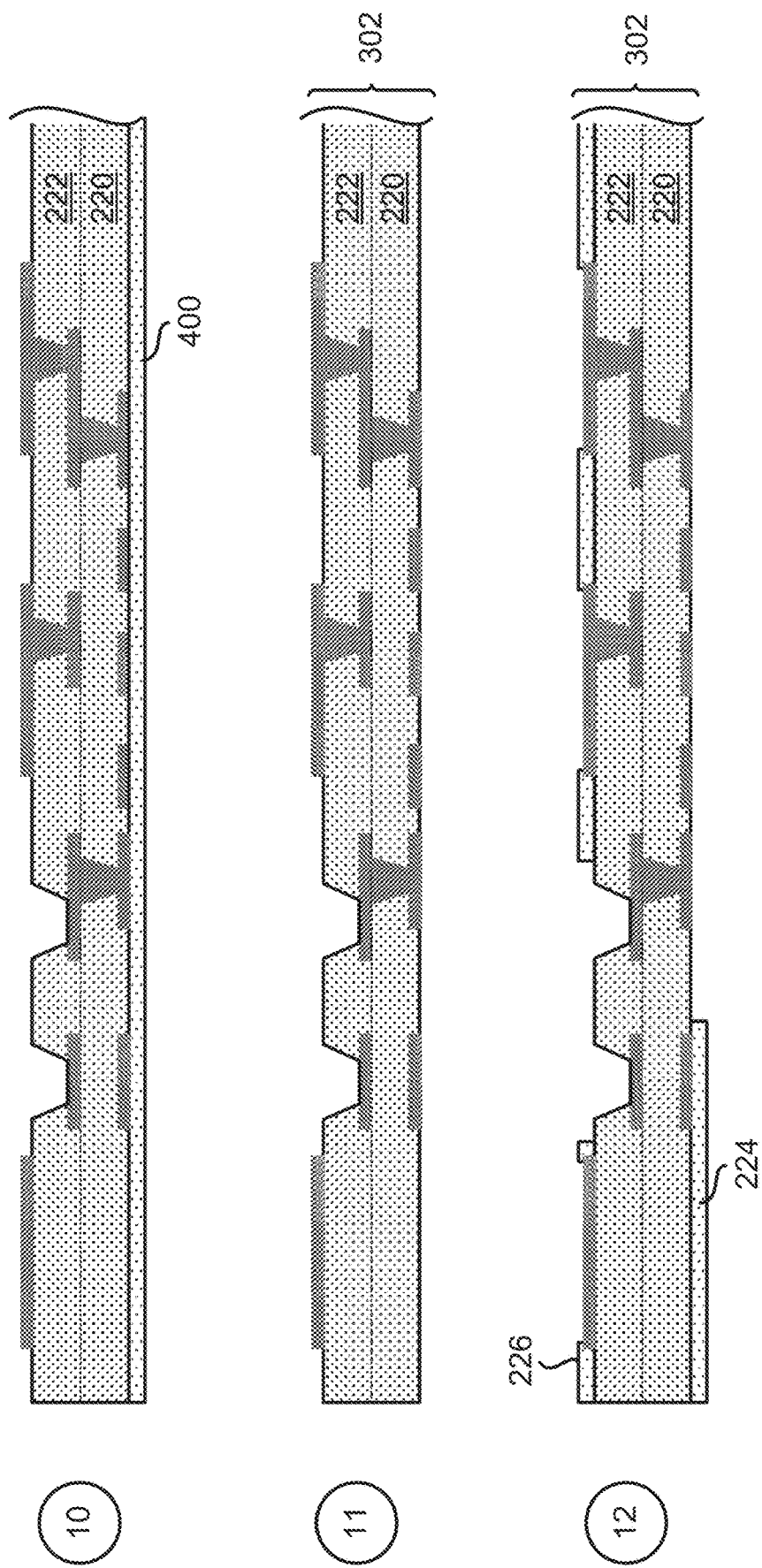

Stage 10, as shown in FIG. 5C, illustrates a state after the dry film layer 440 has been decoupled from the metal layer 420. Stage 10 also illustrates a state where part of the metal layer 420 has been removed (e.g., through metal etching or seed etching).

Stage 11 illustrates a state after the carrier 400 has been decoupled from the dielectric layer 220, leaving the substrate 302, which includes the dielectric layers 220 and 222, the plurality of interconnects 221, the plurality of interconnects 223, and the plurality of interconnects 225.

Stage 12 illustrates a state after the first solder resist layer 224 and the second solder resist layer 226 are formed over the substrate 302. The first solder resist layer 224 is formed over a first surface of the substrate 302, and the second solder resist layer 226 is formed over a second surface of the substrate 302.

Figure 5D:
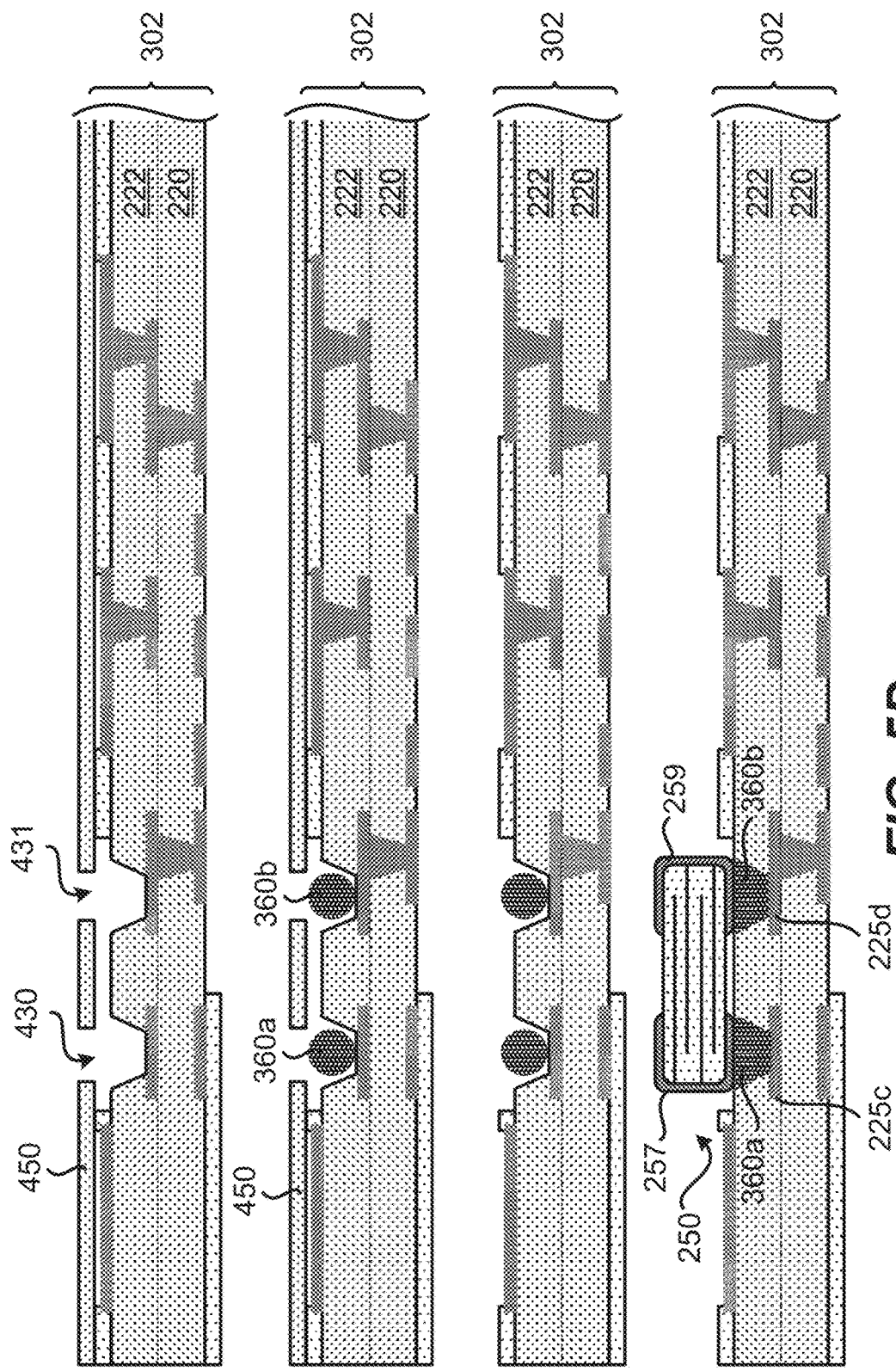

Stage 13, as shown in FIG. 5D, illustrates a state after a mask 450 is formed over the substrate 302. The mask 450 has openings over the cavities 430 and 431.

Stage 14 illustrates a state after the first solder interconnect 360a is provided in the cavity 430, and the second solder interconnect 360b is provided in the cavity 431. In some implementations, the first solder interconnects 360a and the second solder interconnects 360b are provided through a solder printing process. The first solder interconnects 360a and the second solder interconnects 360b may be solder balls.

Stage 15 illustrates a state after the mask 450 has been decoupled from the substrate 302, leaving the first solder interconnects 360a and the second solder interconnects 360b in the cavities 430 and 431, respectively.

Stage 16 illustrates a state after the passive component 250 has been coupled to the substrate 302. In particular, the first terminal 257 of the passive component 250 is coupled to the first solder interconnect 360a, and the second terminal 259 of the passive component 250 is coupled to the second solder interconnect 360b. The first solder interconnect 360a is located in the cavity 430, and the second solder interconnect 360b is located in the cavity 431. The first solder interconnect 360a is coupled to the interconnect 225c, and the second interconnect 360b is coupled to the interconnect 225d. Stage 16 may illustrate a state after a reflow process. Stage 16 illustrates a state where a surface of the passive component 250 is touching and/or aligned with the second surface of the substrate 302.

Figure 5E:
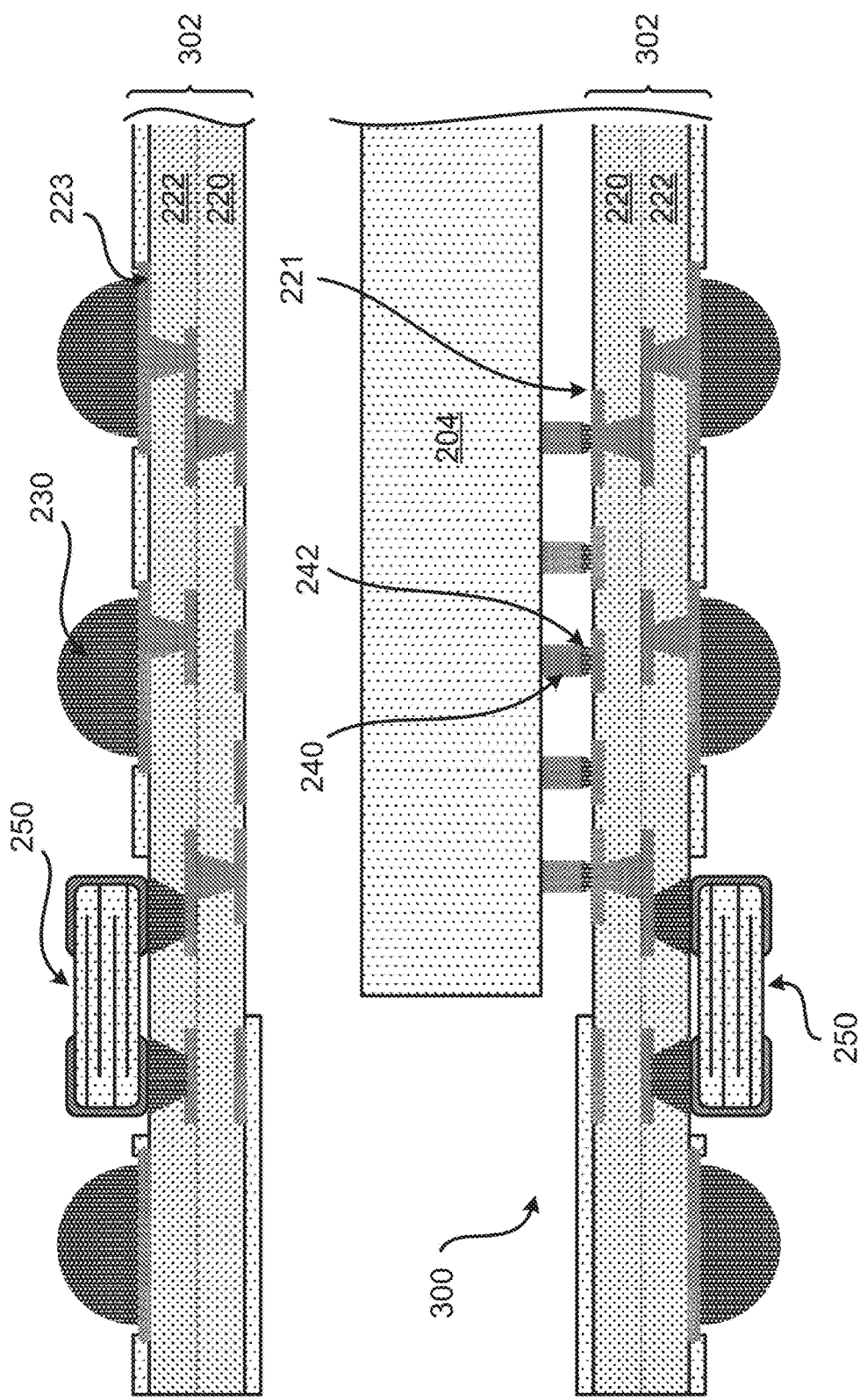

Stage 17, as shown in FIG. 5E, illustrates a state after the plurality of solder interconnects 230 (e.g., solder balls) is coupled to the plurality of interconnects 223.

Stage 18 illustrates a state after the die 204 is coupled to the substrate 302 through the plurality of bump interconnects 240 and the plurality of solder interconnects 242. In some implementations, stage 18 illustrates the device 300 that includes the substrate 302, the die 204 and the passive component 250.

Figure 6:
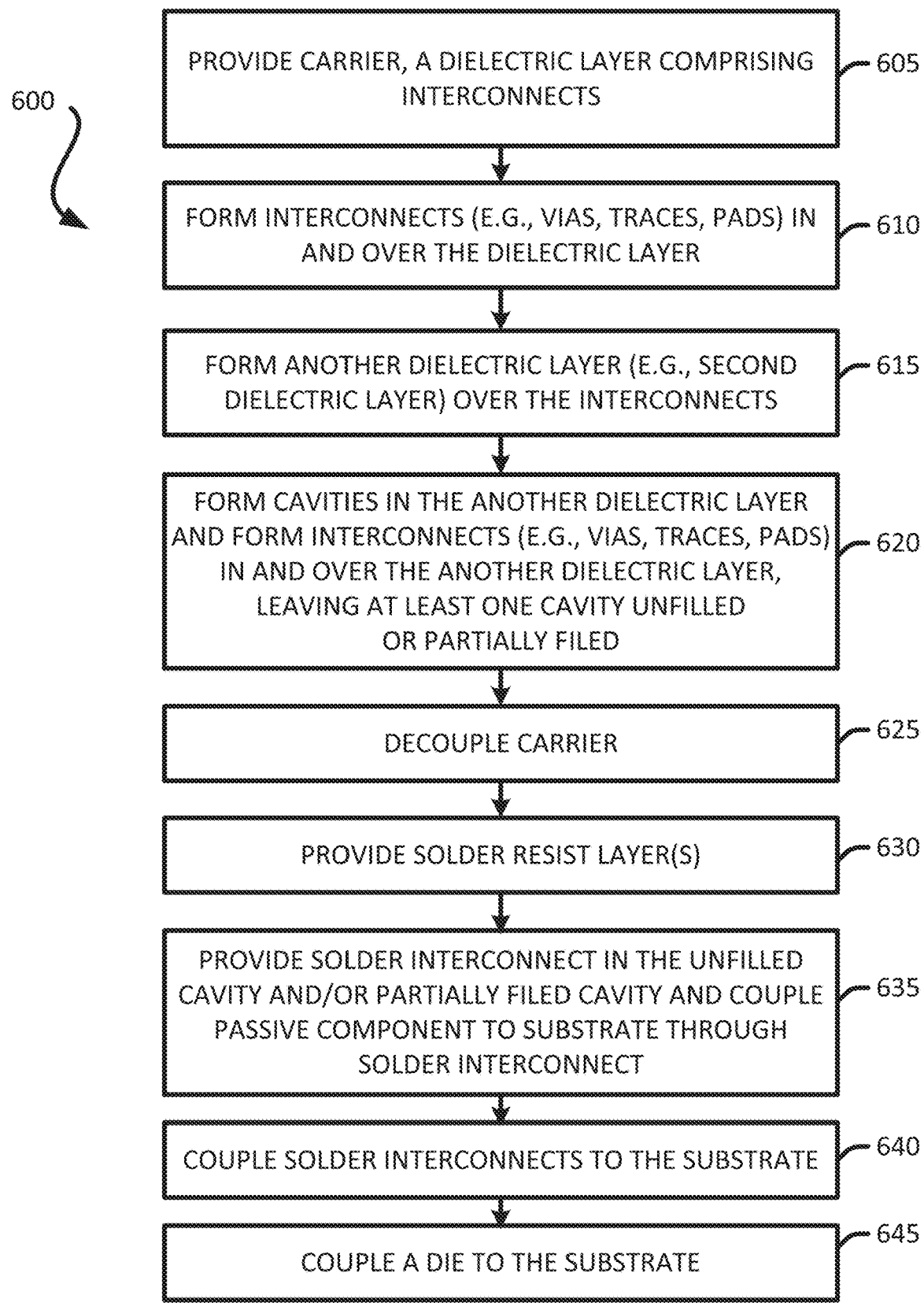
FIG. 6 illustrates an exemplary flow diagram of a method for fabricating an integrated device that includes a die, a substrate and a surface mounted passive component.

Exemplary Flow Diagram of a Method for Fabricating a Device Comprising Substrate with Surface Mounted Discrete Passive Component In some implementations, fabricating a device that includes a substrate and a passive component includes several processes. FIG. 6 illustrates an exemplary flow diagram of a method 600 for providing or fabricating a device that includes a substrate and a passive component. In some implementations, the method 600 of FIG. 6 may be used to provide or fabricate the device of FIG. 2 described in the present disclosure. However, the method 600 may be used to provide or fabricate any of the devices (e.g., 200, 300, 700, 800, 900, 1000) described in the disclosure.

It should be noted that the sequence of FIG. 6 may combine one or more processes in order to simplify and/or clarify the method for providing or fabricating a device. In some implementations, the order of the processes may be changed or modified.

The method provides (at 605) a carrier (e.g., 400), a dielectric layer (e.g., 220) that includes interconnects (e.g., 221). Stages 1-3 of FIG. 4A, illustrates an example of a carrier, a dielectric layer that includes interconnects. In some implementations, providing the carrier, the dielectric layer and the interconnects may also include providing a core layer and interconnects in the core layer.

The method forms (at 610) interconnects (e.g., 225) in and over the dielectric layer (e.g., 220). One or more cavities may be formed in the dielectric layer and a plating process may be used to form the interconnects. The cavities may be formed using an etching process or laser process. Forming interconnects may include providing a patterned metal layer over and/or in the dielectric layer. Stages 4 and 5 of FIG. 4A, illustrate an example of interconnects being formed in and over a dielectric layer.

The method forms (at 615) another dielectric layer (e.g., 222) over the dielectric layer (e.g., 220) and the interconnects. Different implementations may use different processes for forming the dielectric layer. For example, a lamination process may be used to form the dielectric layer. Stage 6 of FIG. 4A, illustrates an example of another dielectric layer (e.g., second dielectric layer) being formed over a dielectric layer.

The method forms (at 620) cavities (e.g., 430, 431, 432) in the another dielectric layer (e.g., 222) and forms interconnects (e.g., 225. 225a, 225b) in and over the another dielectric layer (e.g., second dielectric layer). Forming the interconnects may include providing a dry film layer. A plating process may be used to form the interconnects. The cavities may be formed using an etching process or laser process. Forming interconnects may include providing a patterned metal layer over and/or in the dielectric layer. Some of the cavities may be partially filled or unfilled. Once the interconnects have been formed, the dry film layer may be decoupled. Stages 7-10 of FIGS. 4B and 4C, illustrate an example of cavities and interconnects being formed in and over a dielectric layer.

The method decouples (at 625) the carrier (e.g., 400) from the dielectric layer (e.g., 220). Decoupling the carrier may include removing (e.g., grinding out, etching out) the carrier (e.g., 400) from the dielectric layer, leaving the substrate (e.g., 202, 302). In some implementations, decoupling the carrier from the dielectric layer may be performed in several steps. Stage 11 of FIG. 4C, illustrates an example of a substrate after the carrier has been removed.

The method provides (at 630) solder resist layers (224, 226) over the dielectric layers. Stage 12 of FIG. 4C illustrates an example of providing solder resist layers.

The method provides (at 635) solder interconnects in one or more cavities of the dielectric layer of the substrate. In some implementations, a solder printing process is used to provide the solder interconnects in the cavities. In some implementations, a mask is used in the solder printing process. Stages 13-15 of FIG. 4D illustrate an example of providing solder interconnects in cavities of a dielectric layer of the substrate. The method also couples (at 635) a passive component (e.g., 250, 950) to the substrate through the solder interconnects (e.g., 260a, 260b, 360a, 360b) in the cavities of the dielectric layer. In some implementations, coupling the passive component to the substrate include a reflow process. Stage 16 of FIG. 4D illustrates an example of a state after a passive component has been coupled to a substrate.

The method couples (at 640) solder interconnects (e.g., 230) to the substrate (e.g., 202, 302). Stage 17 of FIG. 4E illustrates a state after solder interconnects (e.g., solder balls) have been coupled to a substrate.

The method couples (at 645) a die (e.g., 204) to the substrate. In some implementations, the die is coupled to the substrate through a plurality of interconnects. Stage 18 of FIG. 4E illustrates a state after a die is coupled to a substrate.

The method 600 of FIG. 6 may be applicable to any of the devices described in the disclosure, including the devices 300, 700, 800, 900 and/or 1000.

Figure 7:
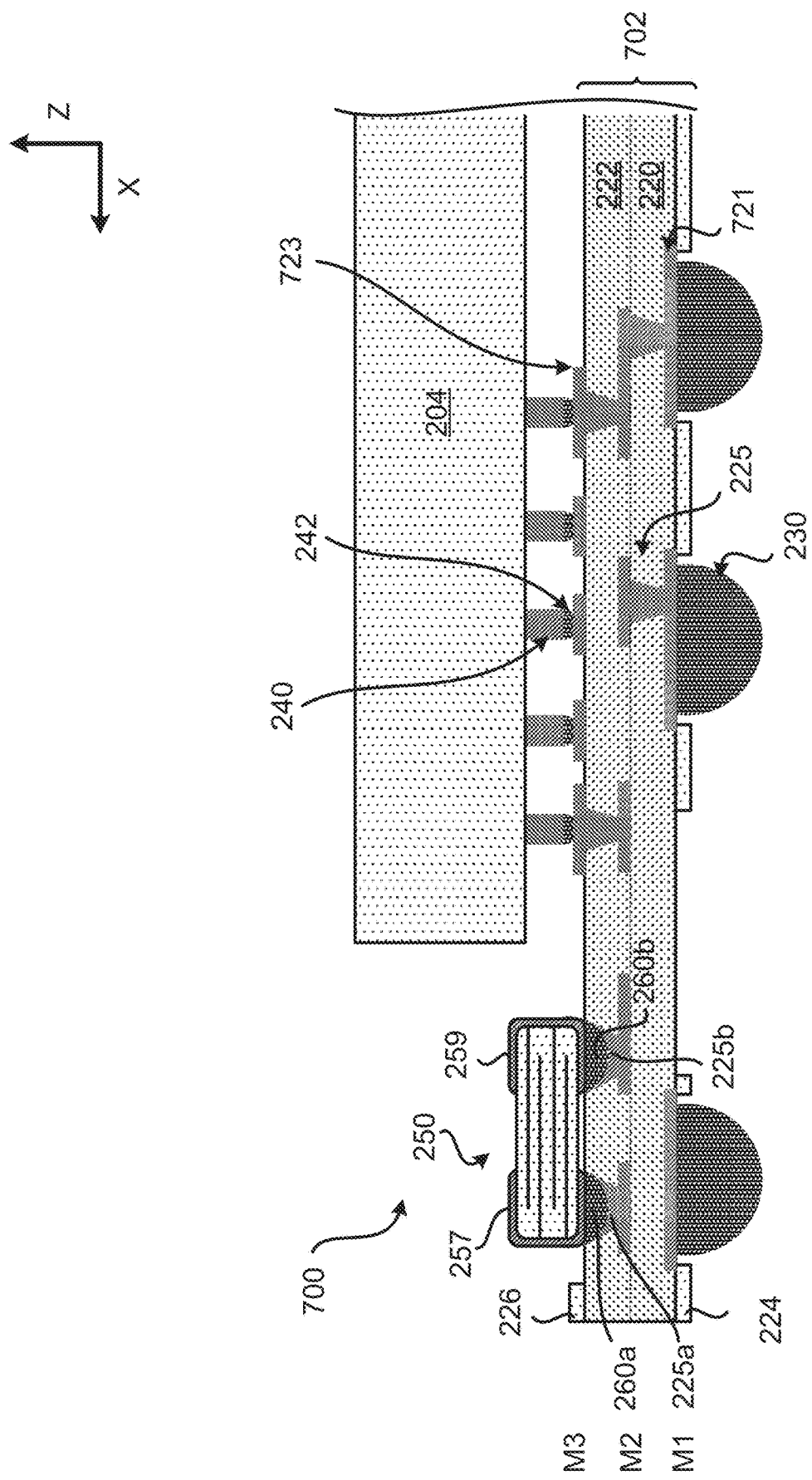
FIG. 7 illustrates a profile view of an integrated device that includes a die, a substrate, and a surface mounted passive component.

Exemplary Devices Comprising a Substrate with Surface Mounted Discrete Passive Component FIG. 7 illustrates another example of a device 700 that includes a passive component coupled to the substrate. The device 700 is similar to the device 200 of FIG. 2. FIG. 7 illustrates that the device 700 includes a substrate 702, the die 204 and the passive component 250. The device 700 may be an integrated device (e.g., integrated circuit device) and/or an integrated package (e.g., integrated circuit package). The substrate 702 may be similar to the substrate 202. The substrate 702 includes the plurality of interconnects 721, the plurality of interconnects 723, and the plurality of interconnects 225.

FIG. 7 illustrates that the passive component 250 is located over the same surface of the substrate 702 as the die 204. The passive component 250 is coupled to the substrate 702 through solder interconnects. In particular, the first terminal 257 of the passive component 250 is coupled to the first solder interconnect 260a, and the second terminal 259 of the passive component 250 is coupled to the second solder interconnect 260b. The first solder interconnect 260a is located in a first cavity of the dielectric layer 222, and the second solder interconnect 260b is located in a second cavity of the dielectric layer 222. The first cavity includes the via 225a (e.g., first partial via). The first solder interconnect 260a is coupled to the via 225a through a curved surface (e.g. concave surface) of the via 225a. The via 225a is coupled to an interconnect 225c (e.g., pad), which is embedded in the dielectric layer of the substrate 702. The second cavity includes a via 225b (e.g., second partial via). The second solder interconnect 260b is coupled to the via 225b through a curved surface (e.g. concave surface) of the via 225b. The via 225b is coupled to an interconnect 225d (e.g., pad) that is embedded in the dielectric layer of the substrate 702. A cavity that includes a partial via and solder interconnect may have a height that is in a range of 15-80 micrometers (μm). For example, the first cavity that includes the via 225a and the first solder interconnect 260a may have a height that is in a range of 15-80 micrometers (μm).

Figure 8:
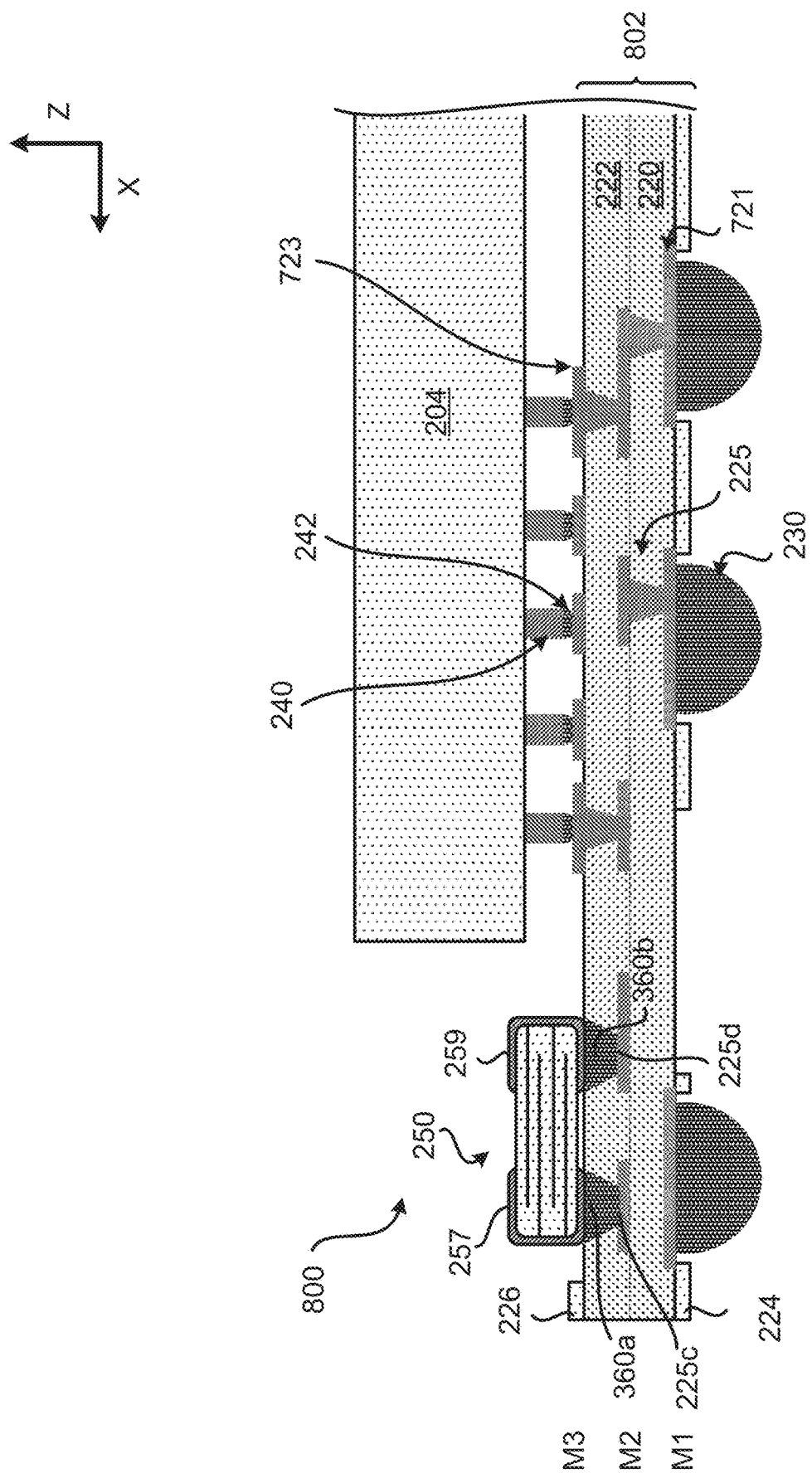
FIG. 8 illustrates a profile view of an integrated device that includes a die, a substrate, and a surface mounted passive component.

FIG. 8 illustrates another example of a device 800 that includes a passive component coupled to the substrate. The device 800 is similar to the device 700 of FIG. 7 and the device 200 of FIG. 2. FIG. 8 illustrates that the device 800 includes a substrate 802, the die 204 and the passive component 250. The device 800 may be an integrated device (e.g., integrated circuit device) and/or an integrated package (e.g., integrated circuit package). The substrate 802 may be similar to the substrate 702 and the substrate 202. The substrate 802 includes the plurality of interconnects 721, the plurality of interconnects 723, and the plurality of interconnects 225.

FIG. 8 illustrates that the passive component 250 is located over the same surface of the substrate 702 as the die 204. The passive component 250 is coupled to the substrate 702 through solder interconnects. In particular, the first terminal 257 of the passive component 250 is coupled to a first solder interconnect 360a, and the second terminal 259 of the passive component 250 is coupled to a second solder interconnect 360b. The first solder interconnect 360a is located in a first cavity of the dielectric layer 222 such that the first solder interconnect 360a occupies a majority (e.g., substantially all) of the cavity, and the second solder interconnect 360b is located in a second cavity of the dielectric layer 222 such that the second interconnect 360b occupies a majority (e.g., substantially all) of the cavity. The first solder interconnect 360a is coupled to the interconnect 225c (e.g., pad), which is embedded in the dielectric layer of the substrate 702.

The second solder interconnect 260b is coupled to the interconnect 225d (e.g., pad), which is embedded in the dielectric layer of the substrate 202. A cavity that includes the solder interconnect may have a height that is in a range of 15-80 micrometers (μm). For example, the first cavity that includes the first solder interconnect 360a may have a height that is in a range of 15-80 micrometers (μm).

Different implementations may use different types of substrate. In some implementations, the substrate may include a core layer.

Figure 9:
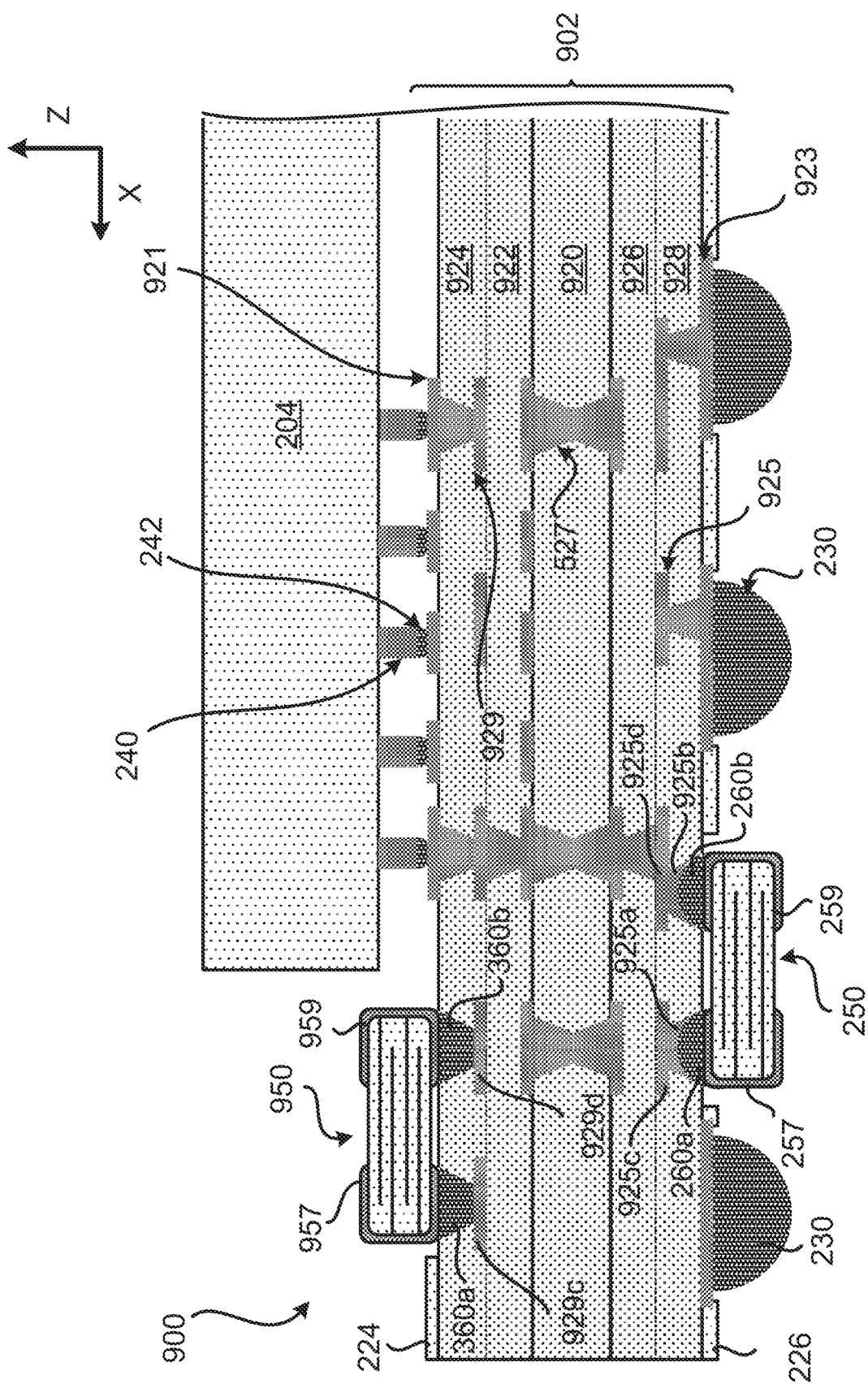
FIG. 9 illustrates a profile view of an integrated device that includes a die, a core substrate, and a surface mounted passive component.

Exemplary Devices Comprising a Core Substrate with Surface Mounted Discrete Passive Component FIG. 9 illustrates a profile view of a device 900 that includes a substrate 902, a die 204, a passive component 250, and a passive component 950. The device 900 may be an integrated device (e.g., integrated circuit device) and/or an integrated package (e.g., integrated circuit package).

The substrate 902 may be a core substrate. The substrate 902 includes a core layer 920, a dielectric layer 922, a dielectric layer 924, a dielectric layer 926, a dielectric layer 928, a first solder resist layer 224, a second solder resist layer 226, a plurality of interconnects 921, a plurality of interconnects 923, a plurality of interconnects 925, a plurality of interconnects 927 and a plurality of interconnects 929.

The core layer 920 may include different dielectric materials, such a silicon, glass, quartz, epoxy, or combinations thereof. The dielectric layers 922, 924, 926 and 928 may be made of the same or different material. Materials for the dielectric layers 922, 924, 926 and 928 may include dry film, such as Ajinomoto build-up film (ABF) and/or prepreg (PPG). The PPG may include glass fibers with resin. Different implementations may include different numbers of dielectric layers. The dielectric layers 922 and 924 may be considered as one dielectric layer. Similarly, the dielectric layers 926 and 928 may be considered as one dielectric layer.

The plurality of interconnects 921 may include traces and/or pads. The plurality of interconnects 921 are formed about a first surface of the substrate 902. For example, the plurality of interconnects 921 may be formed over the first surface of the substrate 902 and/or embedded in the first surface of the substrate 902. The first surface of the substrate 201 may be a first planar surface that faces the die 204.

The die 204 is coupled to the substrate 902 through a plurality of bump interconnects 240 and a plurality of solder interconnects 242. For example, the die 204 may be coupled to the plurality of interconnects 921 through the plurality of bump interconnects 240 and the plurality of solder interconnects 242.

The plurality of interconnects 923 may include traces and/or pads. The plurality of interconnects 923 are formed about a second surface of the substrate 902. For example, the plurality of interconnects 923 may be formed over the second surface of the substrate 902 and/or embedded in the second surface of the substrate 902. The second surface of the substrate 902 may be a second planar surface that faces away from the die 204. The second surface of the substrate 902 may be a surface that is opposite to the first surface of the substrate 902.

The plurality of interconnects 925 may include traces, pads and/or vias. The plurality of interconnects 925 are formed in the dielectric layers 926 and 928 of the substrate 902. The plurality of interconnects 929 may include traces, pads and/or vias. The plurality of interconnects 929 are formed in the dielectric layers 922 and 924 of the substrate 902. The plurality of interconnects 927 may include vias. The vias of the plurality of interconnects 927 may have angled walls. The plurality of interconnects 927 is formed in the core layer of 920 of the substrate 902.

FIG. 9 illustrates that the passive component 250 is coupled to the substrate 902 through solder interconnects. In particular, the first terminal 257 of the passive component 250 is coupled to a first solder interconnect 260a, and the second terminal 259 of the passive component 250 is coupled to a second solder interconnect 260b. The first solder interconnect 260a is located in a first cavity of the dielectric layer 928, and the second solder interconnect 260b is located in a second cavity of the dielectric layer 928. The first cavity includes a via 925a (e.g., first partial via). The first solder interconnect 260a is coupled to the via 925a through a curved surface (e.g. concave surface) of the via 925a. The via 925a is coupled to an interconnect 925c (e.g., pad), which is embedded in the dielectric layer of the substrate 902. The second cavity includes a via 925b (e.g., second partial via). The second solder interconnect 260b is coupled to the via 925b through a curved surface (e.g. concave surface) of the via 925b. The via 925b is coupled to an interconnect 925d (e.g., pad) that is embedded in the dielectric layer of the substrate 902. A cavity that includes a partial via and solder interconnect may have a height that is in a range of 15-80 micrometers (μm). For example, the first cavity that includes the via 925a and the first solder interconnect 260a may have a height that is in a range of 15-80 micrometers (μm).

FIG. 9 also illustrates that the passive component 950 is coupled to the substrate 902 through solder interconnects. The passive component 950 may be similar to the passive component 250, including having the same or similar components. The first terminal 957 of the passive component 950 is coupled to a first solder interconnect 360a, and the second terminal 959 of the passive component 950 is coupled to a second solder interconnect 360b. The first solder interconnect 360a is located in a first cavity of the dielectric layer 924 such that the first solder interconnect 360a occupies a majority (e.g., substantially all) of the cavity, and the second solder interconnect 360b is located in a second cavity of the dielectric layer 924 such that the second interconnect 360b occupies a majority (e.g., substantially all) of the cavity. The first solder interconnect 360a is coupled to the interconnect 929c (e.g., pad), which is embedded in the dielectric layer of the substrate 902. The second solder interconnect 260b is coupled to the interconnect 929d (e.g., pad), which is embedded in the dielectric layer of the substrate 902. A cavity that includes the solder interconnect may have a height that is in a range of 15-80 micrometers (μm). For example, the first cavity that includes the first solder interconnect 360a may have a height that is in a range of 15-80 micrometers (μm).

Figure 10:
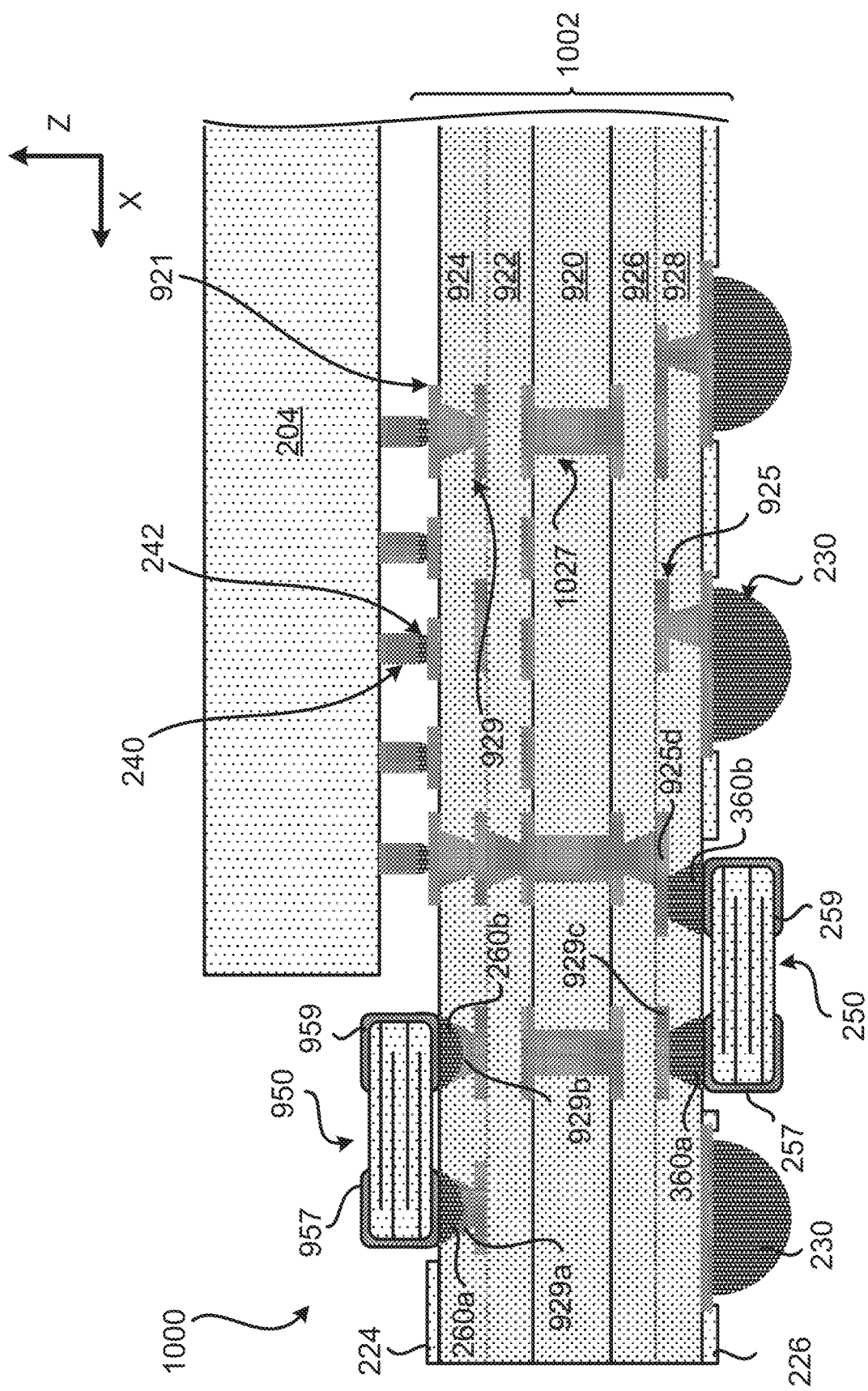
FIG. 10 illustrates a profile view of an integrated device that includes a die, a core substrate, and a surface mounted passive component.

FIG. 10 illustrates another example of a device 1000 that includes passive components coupled to the substrate. The device 1000 is similar to the device 900 of FIG. 9. FIG. 10 illustrates that the device 1000 includes a substrate 1002, the die 204, the passive component 250 and the passive component 950. The device 1000 may be an integrated device (e.g., integrated circuit device) and/or an integrated package (e.g., integrated circuit package). The substrate 1002 is similar to the substrate 902. The substrate 1002 includes a plurality of interconnects 1027 formed in the core layer 920. The plurality of interconnects 1027 may include vias. The vias of the plurality of interconnects 1027 have approximately vertical walls.

FIG. 10 illustrates that the passive component 950 is coupled to the substrate 1002 through solder interconnects. In particular, the first terminal 957 of the passive component 250 is coupled to a first solder interconnect 260a, and the second terminal 959 of the passive component 950 is coupled to a second solder interconnect 260b. The first solder interconnect 260a is located in a first cavity of the dielectric layer 924, and the second solder interconnect 260b is located in a second cavity of the dielectric layer 924. The first cavity includes a via 929a (e.g., first partial via). The first solder interconnect 260a is coupled to the via 929a through a curved surface of the via 929a. The via 929a is coupled to an interconnect 929c (e.g., pad), which is embedded in the dielectric layer of the substrate 1002. The second cavity includes a via 929b (e.g., second partial via). The second solder interconnect 260b is coupled to the via 929b through a curved surface of the via 929b. The via 929b is coupled to an interconnect 929d (e.g., pad) that is embedded in the dielectric layer of the substrate 1002. A cavity that includes a partial via and solder interconnect may have a height that is in a range of 15-80 micrometers (μm). For example, the first cavity that includes the via 929a and the first solder interconnect 260a may have a height that is in a range of 15-80 micrometers (μm).

FIG. 10 illustrates that the passive component 250 is coupled to the substrate 1002 through solder interconnects. The first terminal 257 of the passive component 250 is coupled to a first solder interconnect 360a, and the second terminal 259 of the passive component 250 is coupled to a second solder interconnect 360b. The first solder interconnect 360a is located in a first cavity of the dielectric layer 928 such that the first solder interconnect 360a occupies a majority (e.g., substantially all) of the cavity, and the second solder interconnect 360b is located in a second cavity of the dielectric layer 928 such that the second interconnect 360b occupies a majority (e.g., substantially all) of the cavity. The first solder interconnect 360a is coupled to the interconnect 925c (e.g., pad), which is embedded in the dielectric layer of the substrate 1002. The second solder interconnect 260b is coupled to the interconnect 925d (e.g., pad), which is embedded in the dielectric layer of the substrate 1002. A cavity that includes the solder interconnect may have a height that is in a range of 15-80 micrometers (μm). For example, the first cavity that includes the first solder interconnect 360a may have a height that is in a range of 15-80 micrometers (μm).

FIGS. 9 and 10 illustrate that more than one passive component may be coupled to a substrate. In some implementations, a first passive component (e.g., 250, 950) may be coupled to a first surface of the substrate and a second passive component (e.g., 250, 950) may be coupled to a second surface of the substrate. However, different implementations may have different arrangements of the passive components coupled to a substrate. For example, more than one passive component may be coupled to a surface of the substrate. The sequence of FIGS. 4 and/or 5 may be used to fabricate the device of FIGS. 9 and 10.

Exemplary Electronic Devices

Figure 11:
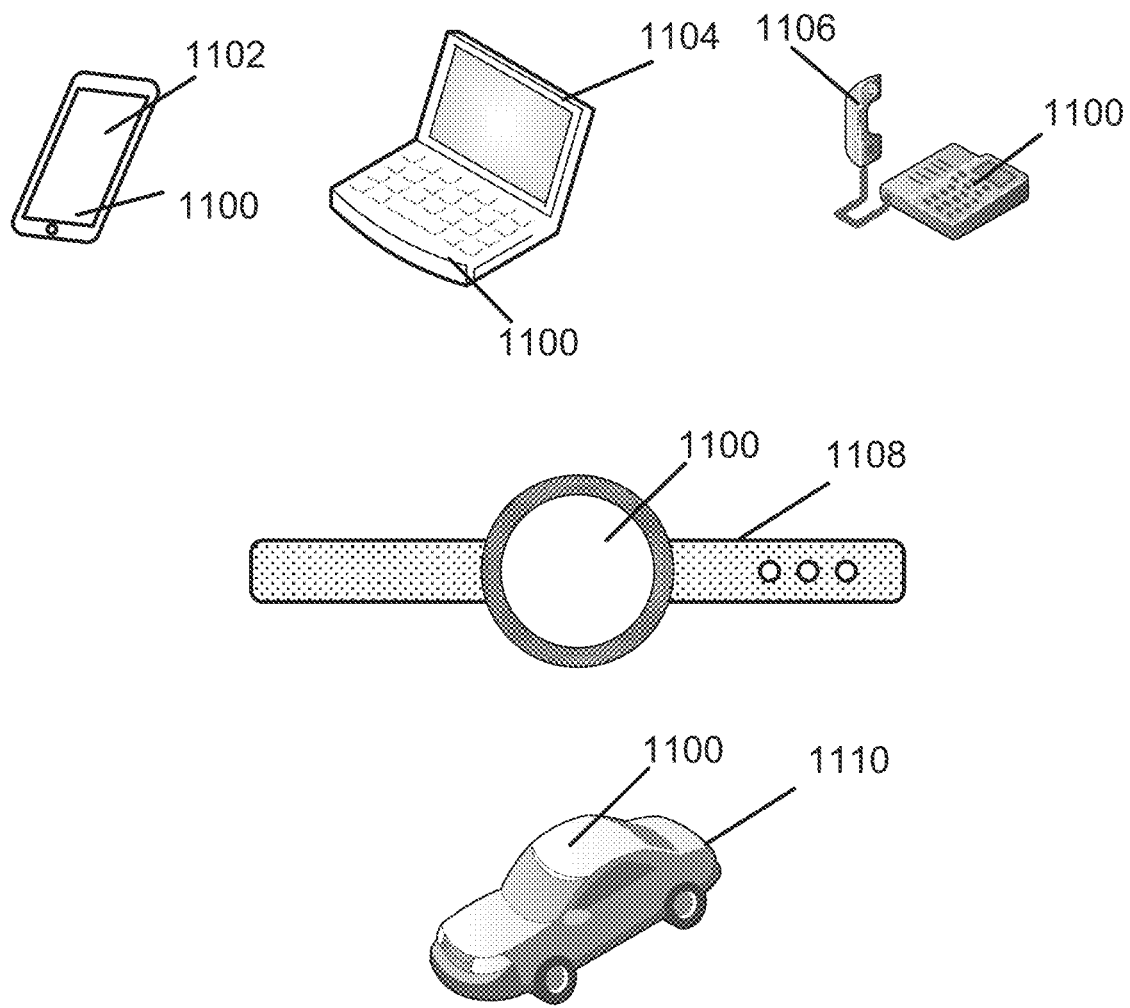
FIG. 11 illustrates various electronic devices that may integrate a die, an integrated device, an integrated passive device (IPD), a passive component, a device package, a package, an integrated circuit and/or a PCB described herein.

FIG. 11 illustrates various electronic devices that may be integrated with any of the aforementioned device, integrated device, integrated circuit (IC) package, integrated circuit (IC) device, semiconductor device, integrated circuit, die, interposer, package or package-on-package (PoP). For example, a mobile phone device 1102, a laptop computer device 1104, a fixed location terminal device 1106, a wearable device 1108, or automotive vehicle 1110 may include a device 1100 as described herein. The device 1100 may be, for example, any of the devices and/or integrated circuit (IC) packages described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-3, 4A-4E, 5A-5E, and/or 6-11 may be rearranged and/or combined into a single component, process, feature or function or embodied in several components, processes, or functions. Additional elements, components, processes, and/or functions may also be added without departing from the disclosure. It should also be noted FIGS. FIGS. 2-3, 4A-4E, 5A-5E, and/or 6-11 and its corresponding description in the present disclosure is not limited to dies and/or ICs. In some implementations, FIGS. 2-3, 4A-4E, 5A-5E, and/or 6-11 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure shall mean within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal, ground or power). An interconnect may be part of a circuit. An interconnect may include more than one element or component.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
 a substrate including:
  a dielectric layer and a cavity in the dielectric layer;

a plurality of interconnects formed in the dielectric layer;
a discrete passive component coupled to a first surface of the substrate, the discrete passive component directly coupled to a solder interconnect, wherein the solder interconnect is located within the cavity of the dielectric layer;
wherein the cavity has a height that is in a range of 15-80 micrometers (μm) and the discrete passive component includes a maximum thickness of 110 micrometers (μm); and
a die coupled to a second surface of the substrate, the second surface of the substrate over the first surface of the substrate.

2. The device of claim 1, wherein the cavity is filled with a via and the solder interconnect.

3. The device of claim 2, wherein the via includes a curved surface coupled to the solder interconnect.

4. The device of claim 1, wherein the first surface of the substrate faces away from the die.

5. The device of claim 1, wherein another discrete passive component is located over the second surface of the substrate.

6. The device of claim 1, wherein the discrete passive component includes a multi-layer ceramic capacitor (MLCC).

7. The device of claim 1, wherein the substrate includes a core layer.

8. The device of claim 1, wherein the dielectric layer includes a plurality of dielectric layers.

9. The device of claim 1, wherein the substrate includes a plurality of solder interconnects having a pitch of 0.35 millimeters (mm) or less.

10. The device of claim 1, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

11. A device comprising:
a substrate including:
a dielectric layer and a plurality of cavities in the dielectric layer; and
a plurality of interconnects formed in the dielectric layer;
means for capacitance coupled to a first surface of the substrate, the means for capacitance directly coupled to means for soldering, wherein the means for soldering is located within a first cavity of the plurality of cavities of the dielectric layer;
wherein the first cavity of the plurality of cavities has a height that is in a range of 15-80 micrometers (μm) and the means for capacitance includes a maximum thickness of 110 micrometers (μm); and
a die coupled to a second surface of the substrate, the second surface of the substrate over the first surface of the substrate.

12. The device of claim 11, wherein the means for soldering includes:
means for first soldering located in the first cavity of the plurality of cavities of the dielectric layer; and
means for second soldering located in a second cavity of the plurality of cavities of the dielectric layer.

13. The device of claim 11, wherein the substrate includes:
the first cavity of the plurality of cavities filled with a first via and means for first soldering; and
a second cavity that is filled with a second via and means for second soldering.

14. The device of claim 13, wherein the first via includes a curved surface coupled to the means for first soldering, and the second via includes a curved surface coupled to the means for second soldering.

15. The device of claim 11, wherein the means for capacitance is located over the first surface of the substrate and the die is located over the second surface of the substrate.

16. The device of claim 11, wherein another means for capacitance is located over the second surface of the substrate.

17. The device of claim 11, wherein the substrate includes a core layer.

18. A method for fabricating a device, comprising:
providing a substrate that includes:
a dielectric layer;
a cavity in the dielectric layer; and
a plurality of interconnects formed in the dielectric layer;
coupling a discrete capacitor to a first surface of the substrate, the discrete capacitor directly coupled to a solder interconnect located within the cavity of the dielectric layer;
wherein the cavity has a height that is in a range of 15-80 micrometers (μm) and the discrete passive component includes a maximum thickness of 110 micrometers (μm); and
coupling a die to a second surface of the substrate, the second surface of the substrate over the first surface of the substrate.

19. The method of claim 18, wherein the cavity is filled with a via and the solder interconnect.

20. The method of claim 19, wherein the via includes a curved surface coupled to the solder interconnect.

21. The method of claim 18, the first surface of the substrate faces away from the die.

22. The method of claim 18 further comprising, coupling another discrete capacitor to the second surface of the substrate.

23. The method of claim 18, wherein the substrate includes a core layer.

24. The method of claim 18, wherein the substrate includes a plurality of dielectric layers.

* * * * *